(12) United States Patent
Lee et al.

(10) Patent No.: US 12,481,212 B2
(45) Date of Patent: Nov. 25, 2025

(54) BLANK MASK AND PHOTOMASK USING THE SAME

(71) Applicant: SK enpulse Co., Ltd., Pyeongtaek-si (KR)

(72) Inventors: Hyung-joo Lee, Suwon-si (KR); Kyuhun Kim, Suwon-si (KR); JiYeon Ryu, Suwon-si (KR); Inkyun Shin, Suwon-si (KR); Seong Yoon Kim, Suwon-si (KR); Suk Young Choi, Suwon-si (KR); Suhyeon Kim, Suwon-si (KR); Sung Hoon Son, Suwon-si (KR); Min Gyo Jeong, Suwon-si (KR)

(73) Assignee: SK enpulse Co., Ltd., Pyeongtaek-si (KR)

( * ) Notice: Subject to any disclaimer, the term of this patent is extended or adjusted under 35 U.S.C. 154(b) by 0 days.

(21) Appl. No.: 18/750,609

(22) Filed: Jun. 21, 2024

(65) Prior Publication Data

US 2024/0345468 A1 Oct. 17, 2024

Related U.S. Application Data

(63) Continuation of application No. 17/567,618, filed on Jan. 3, 2022, now abandoned.

(30) Foreign Application Priority Data

Dec. 31, 2020 (KR) .......................... 10-2020-0189912
Feb. 10, 2021 (KR) .......................... 10-2021-0019157

(Continued)

(51) Int. Cl.
G03F 1/32 (2012.01)
(52) U.S. Cl.
CPC ..................................... G03F 1/32 (2013.01)

(58) Field of Classification Search
None
See application file for complete search history.

(56) References Cited

U.S. PATENT DOCUMENTS

6,666,957 B2 * 12/2003 Watanabe ........... H01J 37/3408
204/192.12
2002/0061452 A1 5/2002 Nozawa et al.
(Continued)

FOREIGN PATENT DOCUMENTS

CN 108957941 A 12/2018
CN 110651225 A 1/2020
(Continued)

OTHER PUBLICATIONS

Chinese Office Action issued on May 22, 2025, in counterpart Chinese Patent Application No. 202111651457.5(5 pages in English, 5 pages in Chinese).

Primary Examiner — Martin J Angebrannдт
(74) Attorney, Agent, or Firm — NSIP Law

(57) ABSTRACT

A blank mask including a transparent substrate, a phase shift film disposed on the transparent substrate, and a light shielding film disposed on the phase shift film. The phase shift film has XRD maximum peak at 2θ of 15° to 30° when normal mode XRD analysis is performed on an upper surface of the phase shift film. The transparent substrate has XRD maximum peak at 2θ of 15° to 30° when performing normal mode XRD analysis on a lower surface of the transparent substrate. AI1 value of the blank mask expressed by below Equation is 0.9 to 1.1.

$$AI1 = \frac{XM1}{XQ1}$$

(Continued)

XM1 is the maximum value of the measured X-ray intensity when the normal mode XRD analysis is performed on upper surface of the phase shift film. XQ1 is the maximum value of the measured X-ray intensity when the normal mode XRD analysis is performed on the lower surface of the transparent substrate.

16 Claims, 21 Drawing Sheets

(30) Foreign Application Priority Data

Feb. 25, 2021 (KR) .................. 10-2021-0025946
Mar. 31, 2021 (KR) .................. 10-2021-0041895

(56) References Cited

U.S. PATENT DOCUMENTS

| | | | |
|---|---|---|---|
| 2002/0125127 A1* | 9/2002 | Watanabe | H01J 37/3455 204/298.2 |
| 2004/0115537 A1 | 6/2004 | Carcia | |
| 2005/0095730 A1 | 5/2005 | Mikami | |
| 2005/0260505 A1 | 11/2005 | Fukushima et al. | |
| 2011/0236604 A1 | 9/2011 | Fujiwara et al. | |
| 2013/0288163 A1 | 10/2013 | Fukaya | |
| 2015/0286132 A1 | 10/2015 | Sakai et al. | |
| 2015/0338731 A1 | 11/2015 | Nozawa et al. | |
| 2016/0291451 A1 | 10/2016 | Nam et al. | |
| 2016/0377975 A1 | 12/2016 | Matsumoto et al. | |
| 2017/0139316 A1 | 5/2017 | Shishido et al. | |
| 2018/0149961 A1 | 5/2018 | Nozawa et al. | |
| 2018/0210331 A1 | 7/2018 | Kajiwara et al. | |
| 2018/0252995 A1 | 9/2018 | Matsumoto et al. | |
| 2022/0206380 A1* | 6/2022 | Lee | G03F 1/32 |
| 2022/0214609 A1 | 7/2022 | Lee et al. | |
| 2022/0244630 A1 | 8/2022 | Nakagawa et al. | |
| 2022/0382141 A1* | 12/2022 | Lee | G03F 1/32 |

FOREIGN PATENT DOCUMENTS

| | | | | |
|---|---|---|---|---|
| CN | 111247457 A | * | 6/2020 | ......... C03C 17/3435 |
| CN | 111758071 A | | 10/2020 | |
| CN | 113073297 A | * | 7/2021 | ......... B23K 26/352 |
| JP | 60-140347 A | | 7/1985 | |
| JP | 07043733 A | * | 2/1995 | |
| JP | 7-159972 A | | 6/1995 | |
| JP | 2002-162726 A | | 6/2002 | |
| JP | 2002-229183 A | | 8/2002 | |
| JP | 2004-199035 A | | 7/2004 | |
| JP | 2005-83834 A | | 3/2005 | |
| JP | 2005-331554 A | | 12/2005 | |
| JP | 2006-93633 A | | 4/2006 | |
| JP | 2006-276648 A | | 10/2006 | |
| JP | 2008240087 A | * | 10/2008 | |
| JP | 4306958 B2 | * | 8/2009 | .......... H01J 37/3408 |
| JP | 4319989 B2 | | 8/2009 | |
| JP | 2010039300 A | * | 2/2010 | |
| JP | 2011-95787 A | | 5/2011 | |
| JP | 2011-112824 A | | 6/2011 | |
| JP | 2016-20949 A | | 2/2016 | |
| JP | 2016-45233 A | | 4/2016 | |
| JP | 2018-54836 A | | 4/2018 | |
| JP | 2019-20712 A | | 2/2019 | |
| JP | 2019-66892 A | | 4/2019 | |
| JP | 6679262 B2 | | 4/2020 | |
| JP | 2020-144358 A | | 9/2020 | |
| KR | 10-0720334 B1 | | 5/2007 | |
| KR | 10-2008-0038744 A | | 5/2008 | |
| KR | 10-2008-0059614 A | | 6/2008 | |
| KR | 10-2008-0089442 A | | 10/2008 | |
| KR | 869268 B1 | * | 11/2008 | ............... G03F 1/32 |
| KR | 10-0890409 B1 | | 3/2009 | |
| KR | 890409 B1 | * | 3/2009 | ........... G02B 6/4201 |
| KR | 10-2009-0050496 A | | 5/2009 | |
| KR | 10-2009-0087153 A | | 8/2009 | |
| KR | 10-2011-0044106 A | | 4/2011 | |
| KR | 10-2012-0134493 A | | 12/2012 | |
| KR | 10-2013-0132925 A | | 12/2013 | |
| KR | 10-1360540 B1 | | 2/2014 | |
| KR | 10-1439877 B1 | | 9/2014 | |
| KR | 10-1504557 B1 | | 3/2015 | |
| KR | 10-2015-0107787 A | | 9/2015 | |
| KR | 10-2016-0022767 A | | 3/2016 | |
| KR | 10-2016-0096727 A | | 8/2016 | |
| KR | 10-2016-0117243 A | | 10/2016 | |
| KR | 10-2016-0141720 A | | 12/2016 | |
| KR | 10-2019-0008110 A | | 1/2019 | |
| KR | 10-2020-0115242 A | | 10/2020 | |
| KR | 2273211 B1 | * | 7/2021 | ............... G03F 1/26 |
| KR | 102400199 B1 | * | 5/2022 | ............... G03F 1/32 |
| TW | 201137511 A | | 11/2011 | |
| TW | I612374 B | | 1/2018 | |
| TW | 201937267 A | | 9/2019 | |
| TW | I673563 B | | 10/2019 | |
| TW | 202040261 A | | 11/2020 | |
| TW | 201800834 A | | 5/2022 | |
| WO | WO-9704360 A1 | * | 2/1997 | ............... G03F 1/32 |
| WO | WO 2007/074806 A1 | | 7/2007 | |
| WO | WO 2009/157506 A1 | | 12/2009 | |
| WO | WO 2020/179463 A1 | | 9/2020 | |
| WO | WO 2020/261986 A1 | | 12/2020 | |

* cited by examiner

BLANK MASK AND PHOTOMASK USING THE SAME

CROSS-REFERENCE TO RELATED APPLICATIONS

This application is a Continuation Application of application Ser. No. 17/567,618, now abandoned, filed Jan. 3, 2022, which claims priority under 35 U.S.C. 119 (a) of Korean Patent Application No. 10-2021-0041895 filed on Mar. 31, 2021, No. 10-2021-0025946 filed on Feb. 25, 2021, No. 10-2020-0189912 filed on Dec. 31, 2020, and No. 10-2021-0019157 filed on Feb. 10, 2021, in the Korean Intellectual Property Office, the entire disclosures of which are incorporated herein by reference for all purposes.

BACKGROUND

1. Field

The present disclosure relates to a blank mask and a photomask using the same.

2. Description of Related Art

Due to high integration of semiconductor devices or the like, miniaturization of circuit patterns of semiconductor devices is being required. For this reason, the importance of a lithography technique, which is a technique for developing a circuit pattern on a wafer surface using a photomask is being further emphasized.

For developing a miniaturized circuit pattern, an exposure light used in an exposure process (photolithography) is required to have a shortened wavelength. As the exposure light used recently, there is ArF excimer laser (wavelength of 193 nm) or the like.

On the other hand, there are Binary mask, Phase shift mask, and the like as photomasks.

The Binary mask has a structure in which a light shielding pattern film is formed on a transparent substrate. In a surface where a light shielding pattern film is formed from the Binary mask, a transmissive portion not including a light shielding pattern film allows exposure light to be transmitted, and a light shielding portion including a light shielding pattern film shields exposure light to transfer a pattern on a resist film of the surface of a wafer. However, the Binary mask may cause a problem in the development of a minute pattern due to diffraction of light occurring at the edge of the transmissive portion as the pattern is being more miniatured.

As a phase shift mask, there are Levenson type, Outrigger type, and Half-tone type. Among the above, Half-tone type phase shift mask has a structure in which a pattern formed with semi-transmissive films is formed on a transparent substrate. In a surface where a pattern is formed from the Half-tone type phase shift mask, a transmissive portion not including a semi-transmissive film allows exposure light to be transmitted, and a semi-transmissive portion including a semi-transmissive layer allows attenuated exposure light to be transmitted. The attenuated exposure light is allowed to have a phase difference compared to exposure light which has transmitted the transmissive portion. Accordingly, diffraction light occurring at the edge of the transmissive portion is counteracted by the exposure light which has transmitted the semi-transmissive portion, and thereby the phase shift mask can form a further refined minute pattern on the surface of a wafer.

As related prior arts, there are Korean Patent Registration No. 10-1360540, U.S. Patent Publication No. 2004-0115537 and Japanese Patent Publication No. 2018-054836.

SUMMARY

A blank mask according to an embodiment includes a transparent substrate; a phase shift film disposed on the transparent substrate; and a light shielding film disposed on the phase shift film.

The blank mask is analyzed by normal mode XRD (X-Ray Diffraction).

When the normal mode XRD analysis is performed on an upper surface of the phase shift film, the phase shift film has a XRD maximum peak at 2θ of 15° to 30°.

When the normal mode XRD analysis is performed on a lower surface of the transparent substrate, the transparent substrate has a XRD maximum peak at 2θ of 15° to 30°.

The blank mask has an AI1 value of 0.9 to 1.1 expressed by Equation 1 below.

$$AI1 = \frac{XM1}{XQ1} \quad \text{[Equation 1]}$$

In Equation 1, the XM1 is the maximum value of the measured X-ray intensity when the normal mode XRD analysis is performed on the upper surface of the phase shift film.

The XQ1 is the maximum value of the measured X-ray intensity when the normal mode XRD analysis is performed on the lower surface of the transparent substrate.

The blank mask may be analyzed by fixed mode XRD.

When the fixed mode XRD analysis is performed on the upper surface of the phase shift film, the phase shift film may have the first peak, which is the XRD maximum peak at 2θ of 15° to 25°.

When the fixed mode XRD analysis is performed on the lower surface of the transparent substrate, the transparent substrate may have the second peak, which is the XRD maximum peak at 2θ of 15° to 25°.

The blank mask may have an AI2 value of 0.9 to 1.1 expressed by Equation 2 below.

$$AI2 = \frac{XM2}{XQ2} \quad \text{[Equation 2]}$$

In the Equation 2, the XM2 is an intensity value of the first peak, and XQ2 is an intensity value of the second peak.

The blank mask may have an AI3 value of 0.9 to 1.1 expressed by Equation 3 below.

$$AI3 = \frac{AM1}{AQ1} \quad \text{[Equation 3]}$$

In the Equation 3, the AM1 is an area of a region where 2θ is 15° to 30° in an X-ray intensity graph measured when normal mode XRD analysis is performed on the upper surface of the phase shift film.

The AQ1 is an area of a region where 2θ is 15° to 30° in an X-ray intensity graph measured when normal mode XRD analysis is performed on the lower surface of the transparent substrate.

The blank mask may have an AI4 value of 0.9 to 1.1 expressed by Equation 4 below.

$$AI4 = \frac{XM4}{XQ4} \quad \text{[Equation 4]}$$

In the Equation 4, the XM4 is the X-ray intensity where 2θ is 43° when the normal mode XRD analysis performed on the upper surface of the phase shift film.

The XQ4 is the X-ray intensity where 2θ is 43° when the normal mode XRD analysis performed on the lower surface of the transparent substrate.

When normal mode XRD analysis is performed on a light shielding film, the light film may have a maximum X-ray intensity value where 2θ is 15° to 30°.

When the XRD analysis is performed on the lower surface of the transparent substrate, the light film may have a maximum X-ray intensity value where 2θ is 15° to 30°.

The blank mask may have an AI5 value of 0.9 to 0.97 expressed by Equation 5 below.

$$AI5 = \frac{XC1}{XQ1} \quad \text{[Equation 5]}$$

In the Equation 5, the XC1 is the maximum value of the X-ray intensity measured on the upper surface of the light shielding film.

The XQ1 is the maximum value of the X-ray intensity measured on the lower surface of the transparent substrate.

The blank mask may have an AI6 value of 1.05 to 1.4 expressed by Equation 6 below.

$$AI6 = \frac{XC4}{XQ4} \quad \text{[Equation 6]}$$

In the Equation 6, the XC4 is the X-ray intensity where 2θ is 43° when the normal mode XRD analysis is performed on the upper surface of the light shielding film.

The XQ4 is the X-ray intensity where 2θ is 43° when the normal mode XRD analysis is performed on the lower surface of the transparent substrate.

In the blank mask, when $PE_1$ is 1.5 eV and $PE_2$ is 3 eV, the photon energy of incident light at the point where the Del_1 value according to Equation 7 below is 0 may be 1.8 to 2.14 eV.

$$\text{Del}\_1 = \lim_{\Delta PE \to 0} \left(\frac{\Delta DPS}{\Delta PE}\right) \quad \text{[Equation 7]}$$

In the Equation 7, when the phase shift film is measured with a spectroscopic ellipsometer by applying an incident angle of 64.5°, the DPS value is the phase difference between the P wave and the S wave if the phase difference between the P wave and the S wave of the reflected light is 180° or less, or a value obtained by subtracting the phase difference between the P wave and the S wave from 360° if the phase difference between the P wave and the S wave of the reflected light is more than 180°.

The PE value is the photon energy of the incident light within the range of the $PE_1$ value to the $PE_2$ value.

In the blank mask, when the $PE_1$ value is 3.0 eV and the $PE_2$ value is 5.0 eV, the photon energy of incident light at the point where the Del_1 value is 0 may be 3.8 to 4.64 eV.

In the blank mask, when the $PE_1$ value is 1.5 eV and the $PE_2$ value is a minimum value within photon energy values of incident light at a point where the Del_1 value is 0, the average value of the Del_1 may be 78 to 98°/eV.

In the blank mask, when the $PE_1$ value is the minimum value within photon energy values of the incident light at the point where the Del_1 value is 0, and the $PE_2$ value is the maximum value within the photon energy values of the incident light at the point where the Del_1 value is 0, an average value of the Del_1 may be −65 to −55 eV.

In the blank mask, when the $PE_1$ value is the maximum value within photon energy values of incident light at the point where the Del_1 value is 0 and the $PE_2$ value is 5.0 eV, the average value of the Del_1 may be 60 to 120°/eV.

The blank mask may have a maximum value of the Del_1 value of 105 to 300°/eV when the $PE_1$ value is 1.5 eV and the $PE_2$ value is 5.0 eV, the The blank mask may have a photon energy of the incident light of 4.5 eV or more at a point where the Del_1 value has the maximum value.

The phase shift film may include a phase difference adjustment layer and a protective layer disposed on the phase difference adjustment layer.

The phase shift film may include a transition metal, silicon, oxygen, and nitrogen.

The phase difference adjustment layer may include nitrogen in an amount of 40 to 60 atom %.

The protective layer may include nitrogen in an amount of 20 to 40 atom %.

The protective layer may include a region in which a ratio of nitrogen content to oxygen content is 0.4 to 2 in the thickness direction.

The region may have a thickness of 30 to 80% compared to a total thickness of the protective layer.

A blank mask according to another embodiment includes a transparent substrate; a phase shift film disposed on the transparent substrate; and a light shielding film disposed on the phase shift film.

The blank mask may have a photon energy of the incident light at the point where Del_1 is 0 expressed by Equation 7 below of 3.8 to 4.64 eV when the $PE_1$ value is 3.0 eV and the PE2 value is 5.0 eV.

$$\text{Del}\_1 = \lim_{\Delta PE \to 0} \left(\frac{\Delta DPS}{\Delta PE}\right) \quad \text{[Equation 7]}$$

In the Equation 7, the DPS value is, when the light shielding film is removed from the blank mask and after that the surface of the phase shift film is measured with a spectroscopic ellipsometer by applying an incident angle of 64.5°, the phase difference between the P wave and the S wave if the phase difference between the P wave and the S wave is 180° or less, or a value obtained by subtracting the phase difference between the P wave and the S wave from 360° if the phase difference between the P wave and the S wave of the reflected light is more than 180°.

The PE value is the photon energy of the incident light within the range of $PE_1$ to $PE_2$.

In the blank mask, when the $PE_1$ value is 1.5 eV and the $PE_2$ value is 3.0 eV, the photon energy of the incident light at the point where the Del_1 value is 0 may be 1.8 to 2.14 eV.

In the blank mask, when the $PE_1$ value is 1.5 eV and the $PE_2$ value is a minimum value within photon energy values of incident light at a point where the Del_1 value is 0, the average value of the Del_1 is 78 to 98°/eV.

In the blank mask, when the $PE_1$ value is the minimum value within photon energy values of the incident light at the point where the Del_1 value is 0 and the $PE_2$ value is the maximum value within the photon energy values of the incident light at the point where the Del_1 value is 0, an average value of the Del_1 may be −65 to −55°/eV.

In the blank mask, when the $PE_1$ value is the maximum value within photon energy values of incident light at the point where the Del_1 value is 0 and the $PE_2$ value is 5.0 eV, the average value of the Del_1 may be 60 to 120°/eV.

In the blank mask, when the $PE_1$ value is 1.5 eV and the $PE_2$ value is 5.0 eV, the maximum value of the Del_1 may be 105 to 300°/eV.

The blank mask may have a photon energy of the incident light of 4.5 eV or more at a point having the maximum value of the Del_1.

The blank mask may be analyzed by normal mode XRD.

When the normal mode XRD analysis is performed on the upper surface of the phase shift film, the phase shift film may have the XRD maximum peak at 2θ of 15° to 30°.

When the normal mode XRD analysis is performed on the lower surface of the transparent substrate, the transparent substrate may have the XRD maximum peak at 2θ of 15° to 30°.

The blank mask may have an AI1 value of 0.9 to 1.1 expressed by Equation 1 below.

$$AI1 = \frac{XM1}{XQ1} \qquad \text{[Equation 1]}$$

In the Equation 1, the XM1 is the maximum value of the X-ray intensity measured when the normal mode XRD analysis is performed on the upper surface of the phase shift film.

The XQ1 is the maximum value of the X-ray intensity measured when the normal mode XRD analysis is performed on the lower surface of the transparent substrate.

The blank mask may be analyzed by fixed mode XRD.

When the fixed mode XRD analysis is performed on the upper surface of the phase shift film, the first peak, which is the maximum peak of the X-ray intensity measured may be located at 2θ of 15° to 25°.

When the fixed mode XRD analysis is performed on the lower surface of the transparent substrate, the second peak, which is the maximum peak of the X-ray intensity measured may be located at 2θ of 15° to 25°.

The blank mask may have an AI2 value of 0.9 to 1.1 expressed by Equation 2 below.

$$AI2 = \frac{XM2}{XQ2} \qquad \text{[Equation 2]}$$

In the Equation 2, the XM2 is the intensity value of the first peak, and the XQ2 is the intensity value of the second peak.

In an embodiment, the photomask may have an AI3 value of 0.9 to 1.1 expressed by Equation 3 below.

$$AI3 = \frac{AM1}{AQ2} \qquad \text{[Equation 3]}$$

In the Equation 3, the AM1 is an area of a region where 2θ is between 15° and 30° in an X-ray intensity graph measured when normal mode XRD analysis is performed on the upper surface of the phase shift film.

The AQ1 is an area of a region where 2θ is between 15° and 30° in an X-ray intensity graph measured when normal mode XRD analysis is performed on the lower surface of the transparent substrate.

In an embodiment, the photomask may have an AI4 value of 0.9 to 1.1 expressed by Equation 4 below.

$$AI4 = \frac{XM4}{XQ4} \qquad \text{[Equation 4]}$$

In the Equation 4, the XM4 is the X-ray intensity where 2θ is 43° when the normal mode XRD analysis performed on the upper surface of the phase shift film.

The XQ4 is the X-ray intensity where 2θ is 43° when the normal mode XRD analysis performed on the lower surface of the transparent substrate.

When normal mode XRD analysis is performed on the upper surface of the light shielding film, the light shielding film may have the maximum value of the X-ray intensity where 2θ is 15° to 30°.

When the XRD analysis is performed through the lower surface of the transparent substrate, the transparent substrate may have a maximum value of the X-ray intensity where 2θ is 15° to 30°.

The blank mask may have an AI5 value of 0.9 to 0.97 expressed by Equation 5 below.

$$AI5 = \frac{XC1}{XQ1} \qquad \text{[Equation 5]}$$

In the Equation 5, the XC1 is the maximum value of the X-ray intensity measured on the upper surface of the light shielding film.

The XQ1 is the maximum value of the X-ray intensity measured on the lower surface of the transparent substrate.

The blank mask may have an AI6 value of 1.05 to 1.4 expressed by Equation 6 below.

$$AI6 = \frac{XC4}{XQ4} \qquad \text{[Equation 6]}$$

In the Equation 6, the XC4 is the X-ray intensity where 2θ is 43° when the normal mode XRD analysis performed on the upper surface of the light shielding film.

The XQ4 is the X-ray intensity where 2θ is 43° when the normal mode XRD analysis performed on the lower surface of the transparent substrate.

The phase shift film may include a phase difference adjustment layer and a protective layer disposed on the phase difference adjustment layer.

The phase shift film may include a transition metal, silicon, oxygen, and nitrogen.

The phase difference adjustment layer may include nitrogen in an amount of 40 to 60 atom %.

The protective layer may include nitrogen in an amount of 20 to 40 atom %.

The protective layer may include a region in which a ratio of nitrogen content to oxygen content is 0.4 to 2 in the thickness direction.

The region may have a thickness of 30 to 80% compared to a total thickness of the protective layer.

A photomask according to another embodiment includes a transparent substrate; a phase shift film disposed on the transparent substrate; and a light shielding film disposed on at least some of the phase shift film.

The photomask is analyzed by normal mode XRD.

When the normal mode XRD analysis is performed on the upper surface of the phase shift film, the maximum peak of the X-ray intensity measured is located at 2θ of 15° to 30°.

When the normal mode XRD analysis is performed on the lower surface of the transparent substrate, the maximum peak of the X-ray intensity measured is located at 2θ of 15° to 30°.

The AI1 value expressed by the Equation 1 below is 0.9 to 1.1.

$$AI1 = \frac{XM1}{XQ1} \quad \text{[Equation 1]}$$

In the Equation 1, the XM1 is the maximum value of the X-ray intensity measured when the normal mode XRD analysis is performed on the upper surface of the phase shift film.

The XQ1 is the maximum value of the X-ray intensity measured when the normal mode XRD analysis is performed on the lower surface of the transparent substrate.

A photomask according to another embodiment includes a transparent substrate; a phase shift film disposed on the transparent substrate; and a light shielding film disposed on the phase shift film.

When the $PE_1$ value is 3.0 eV and the $PE_2$ value is 5.0 eV, the photon energy of the incident light at the point where Del_2 is 0 expressed by Equation 8 below is 3.8 to 4.64 eV.

$$\text{Del\_1} = \lim_{\Delta PE \to 0} \left( \frac{\Delta DPS}{\Delta PE} \right) \quad \text{[Equation 8]}$$

In the Equation 8, the DPS value is, when the light shielding film is removed and after that the phase shift film is measured with a spectroscopic ellipsometer by applying an incident angle of 64.5°, the DPS value is the phase difference between the P wave and the S wave if the phase difference between the P wave and the S wave of the reflected light is 180° or less, or a value obtained by subtracting the phase difference between the P wave and the S wave from 360° if the phase difference between the P wave and the S wave of the reflected light is more than 180°.

The PE value is the photon energy of the incident light within the range of $PE_1$ to $PE_2$.

DETAILED DESCRIPTION

Hereinafter, example embodiments of the present disclosure will be described in detail with reference to the accompanying drawings so that they can be easily practiced by those skilled in the art to which the present application pertains. However, the example embodiments may be embodied in many different forms and is not to be construed as being limited to the embodiments set forth herein.

In this application, the term for degree like "about", "substantially" and the like is used for meaning values approximative from/to the value when a tolerance proper to referred meaning for manufacture and substance is presented. Additionally, these terms for degree are used to help understanding of example embodiments and to prevent that an unconscionable trespasser unjustly uses the presented content in which exact or absolute number is referred.

Throughout this application, the phrase "combination(s) thereof" included in a Markush-type expression denotes one or more mixtures or combinations selected from the group consisting of components stated in the Markush-type expression, that is, denotes one or more components selected from the group consisting of the components are included.

Throughout this application, the description of "A and/or B" means "A, B, or A and B."

Throughout this application, terms such as "first", "second", "A", or "B" are used to distinguish the same terms from each other unless specially stated otherwise.

In this application, "B being placed on A" means that B is placed in direct contact with A or placed over A with another layer or structure interposed therebetween and thus should not be interpreted as being limited to B being placed in direct contact with A.

In this application, a singular form is contextually interpreted as including a plural form as well as a singular form unless specially stated otherwise.

In this application, drawings are disclosed for illustration of example embodiments, some thereof may be expressed by being exaggerated or omitted, and the drawings are not expressed according to a reduced scale.

Figure 11:
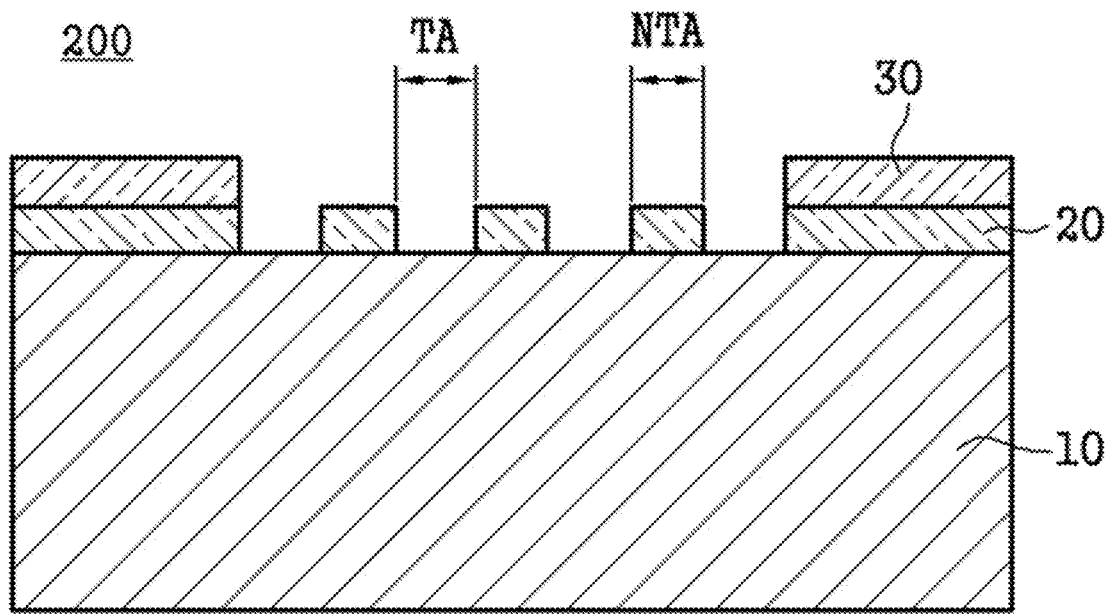
FIG. 11 is a sectional view for illustrating a photomask according to another embodiment.
Figure 12:
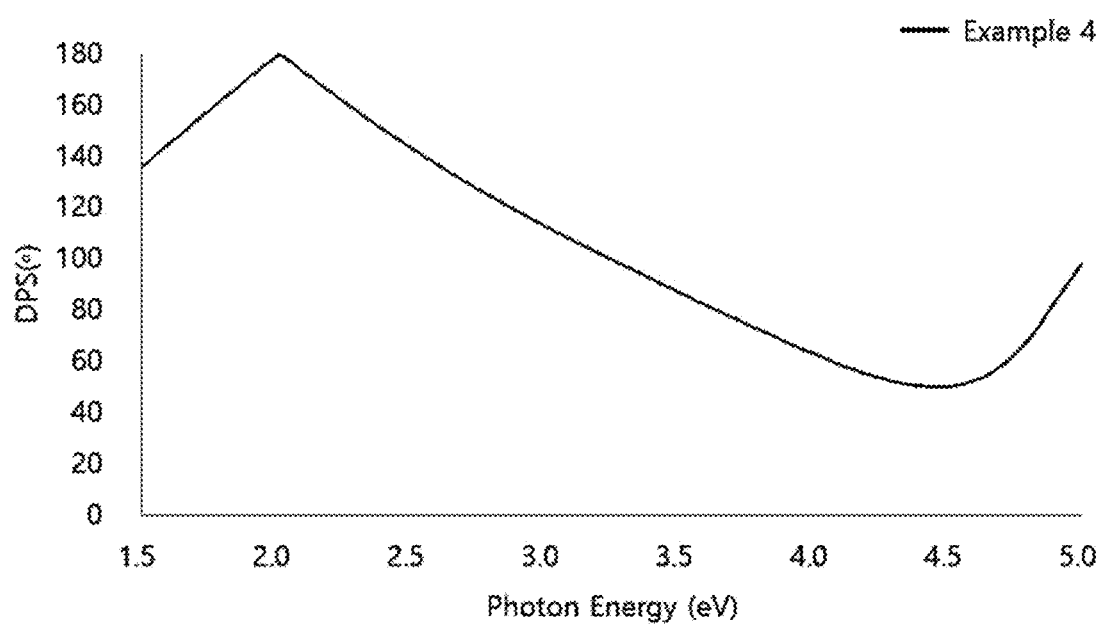
FIG. 12 is a graph of measuring distribution of DPS value depending on Photon energy of incident light of Examples 4.
Figure 13:
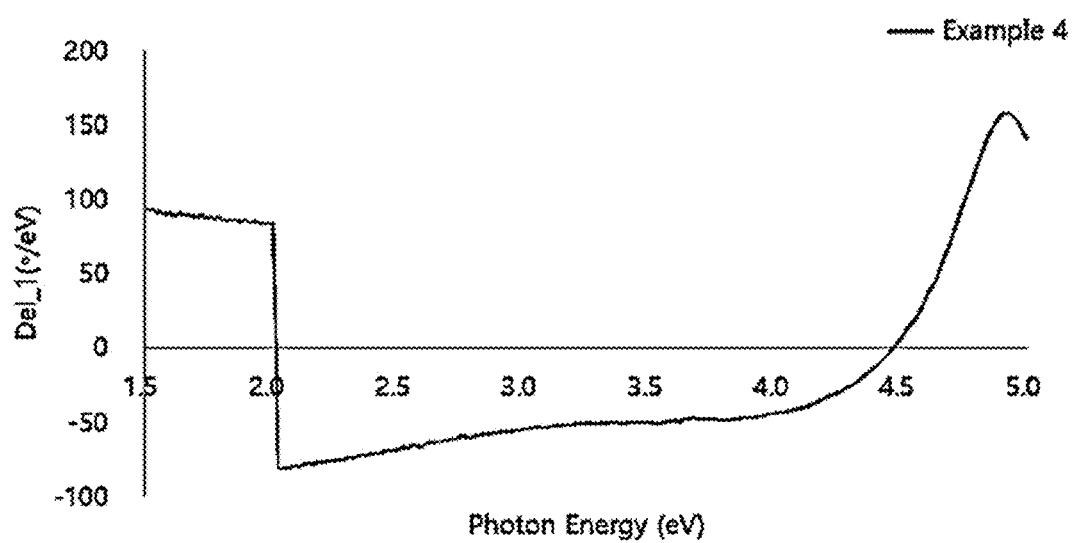
FIG. 13 is a graph of measuring distribution of Del_2 value depending on Photon energy of incident light of Example 4.
Figure 14:
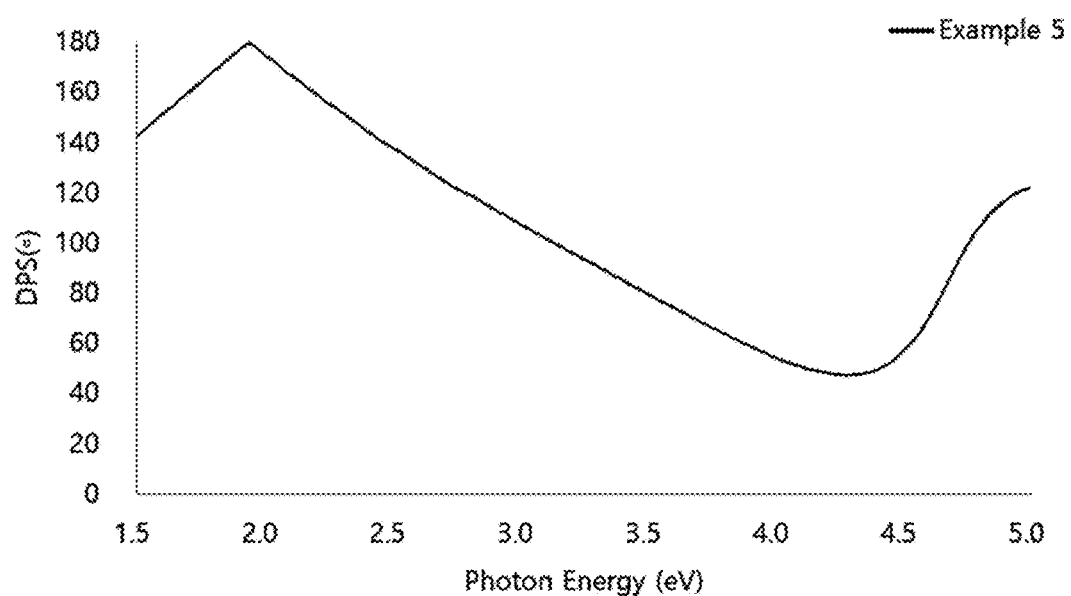
FIG. 14 is a graph of measuring distribution of DPS value depending on Photon energy of incident light of Examples 5.
Figure 15:
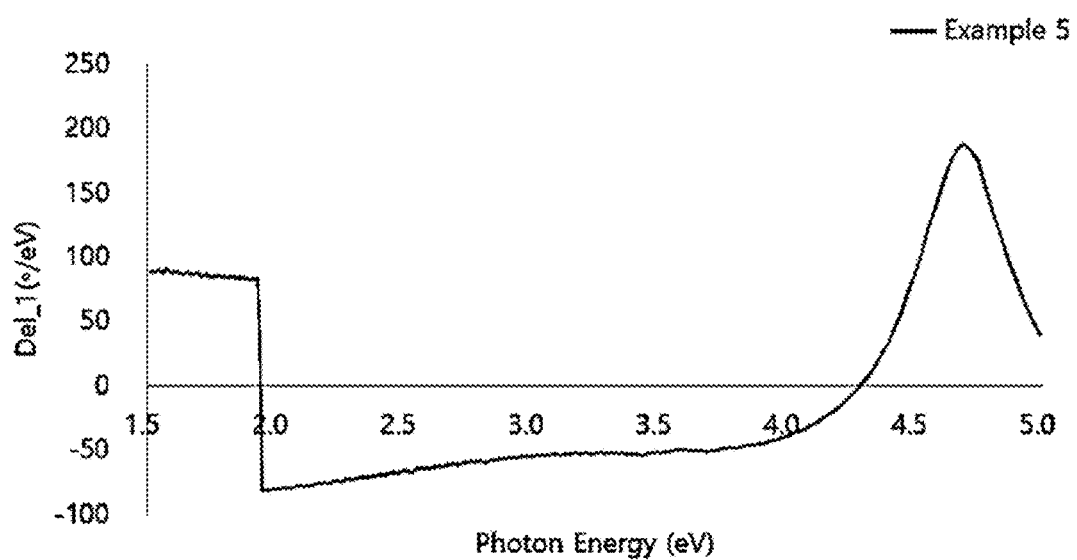
FIG. 15 is a graph of measuring distribution of Del_2 value depending on Photon energy of incident light of Example 5.
Figure 16:
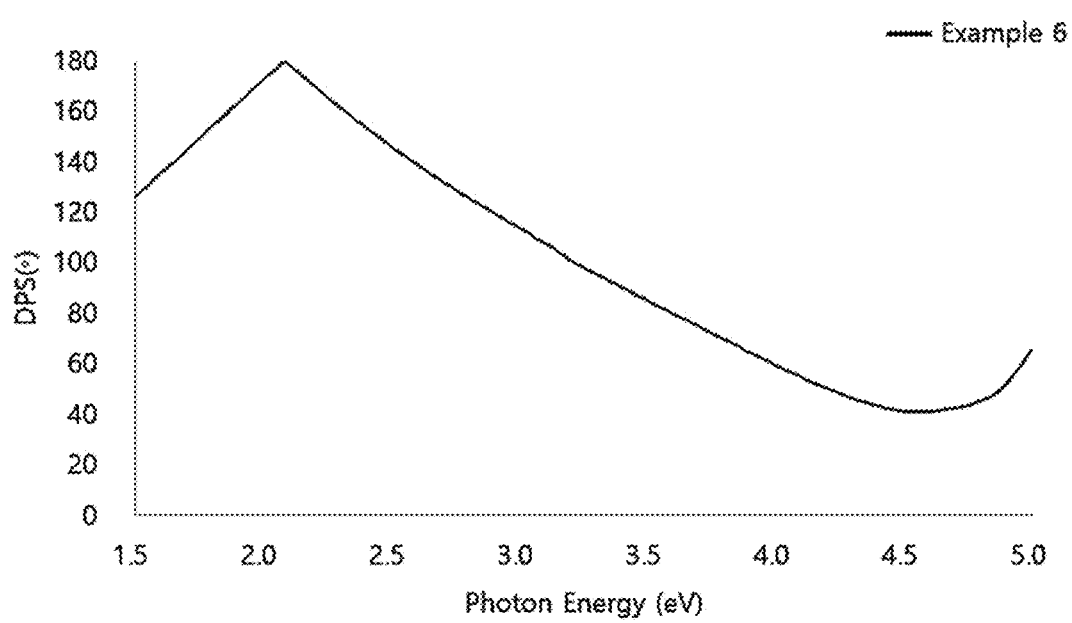
FIG. 16 is a graph of measuring distribution of DPS value depending on Photon energy of incident light of Examples 6.
Figure 17:
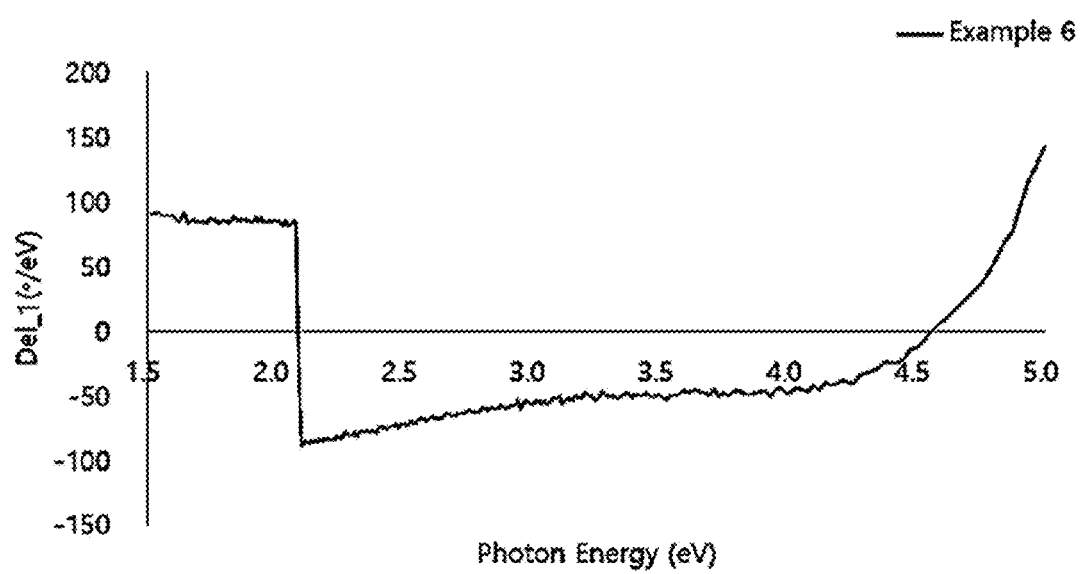
FIG. 17 is a graph of measuring distribution of Del_2 value depending on Photon energy of incident light of Example 6.
Figure 18:
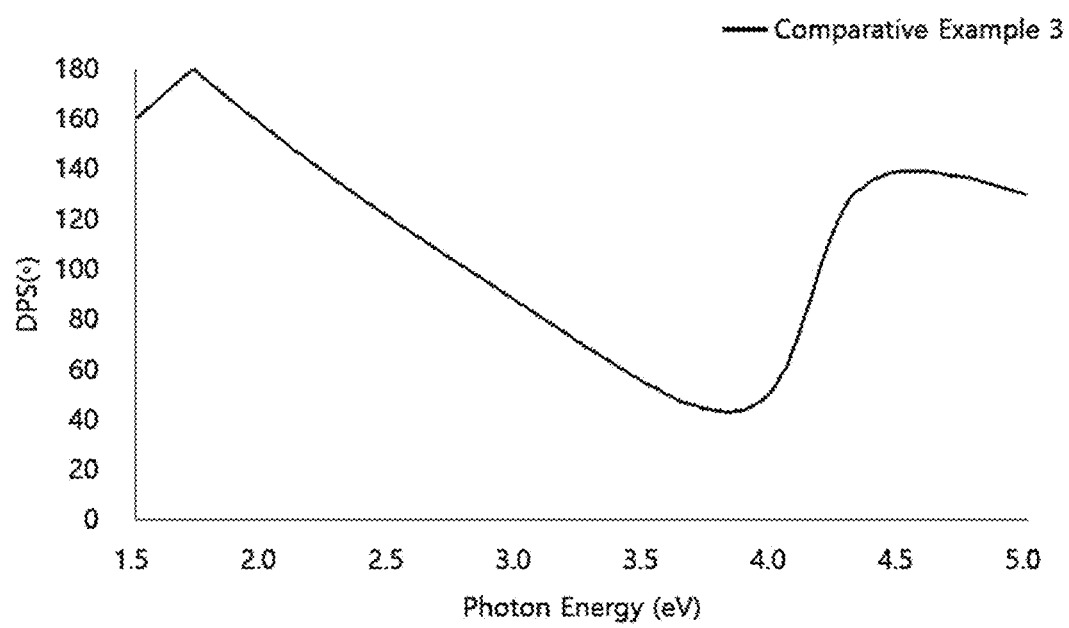
FIG. 18 is a graph of measuring distribution of DPS value depending on Photon energy of incident light of Comparative Examples 3.
Figure 19:
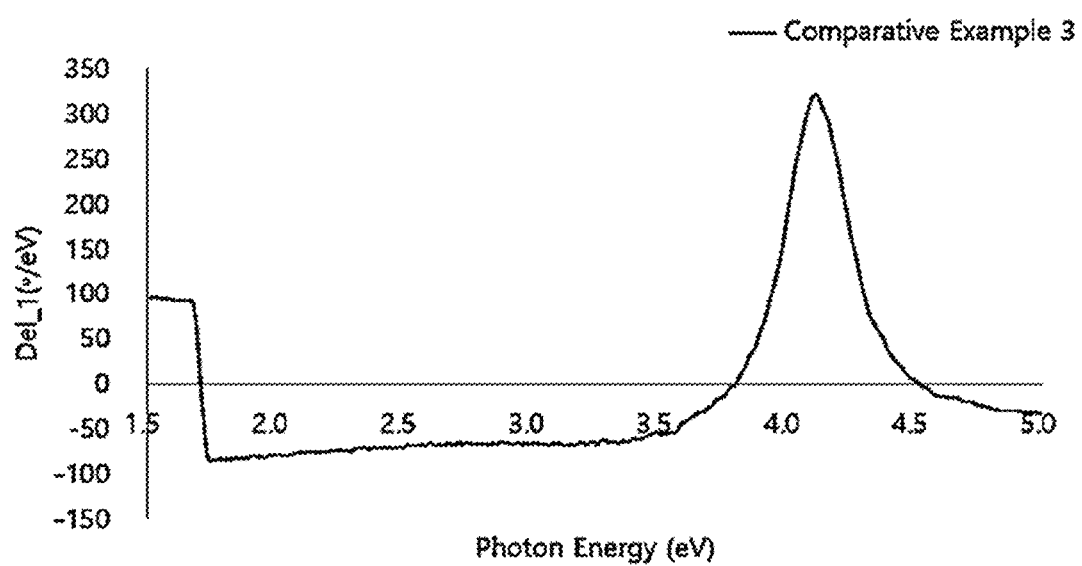
FIG. 19 is a graph of measuring distribution of Del_2 value depending on Photon energy of incident light of Comparative Examples 3.
Figure 20:
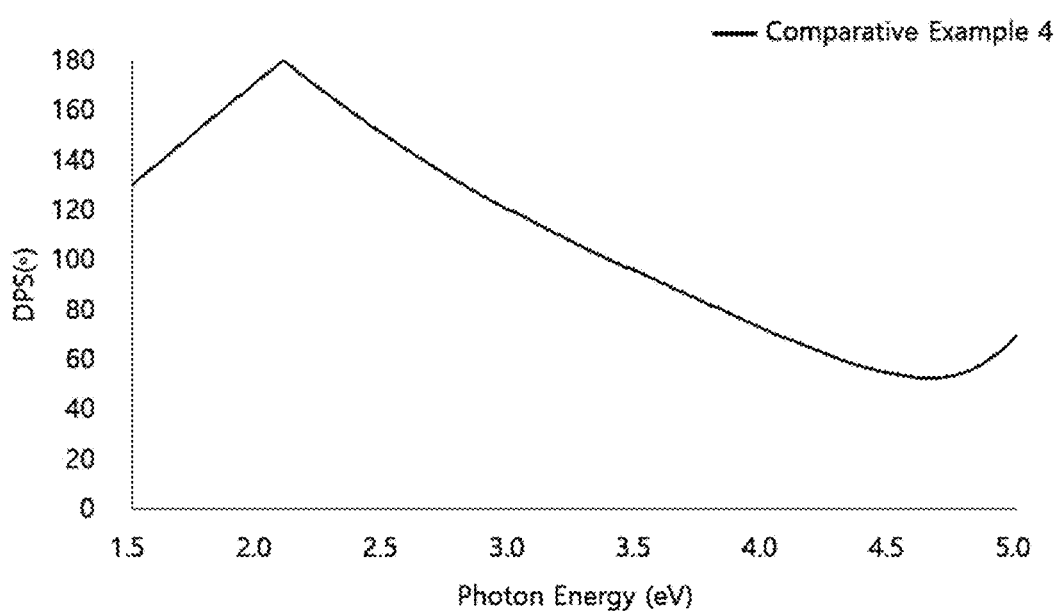
FIG. 20 is a graph of measuring distribution of DPS value depending on Photon energy of incident light of Comparative Examples 4.
Figure 21:
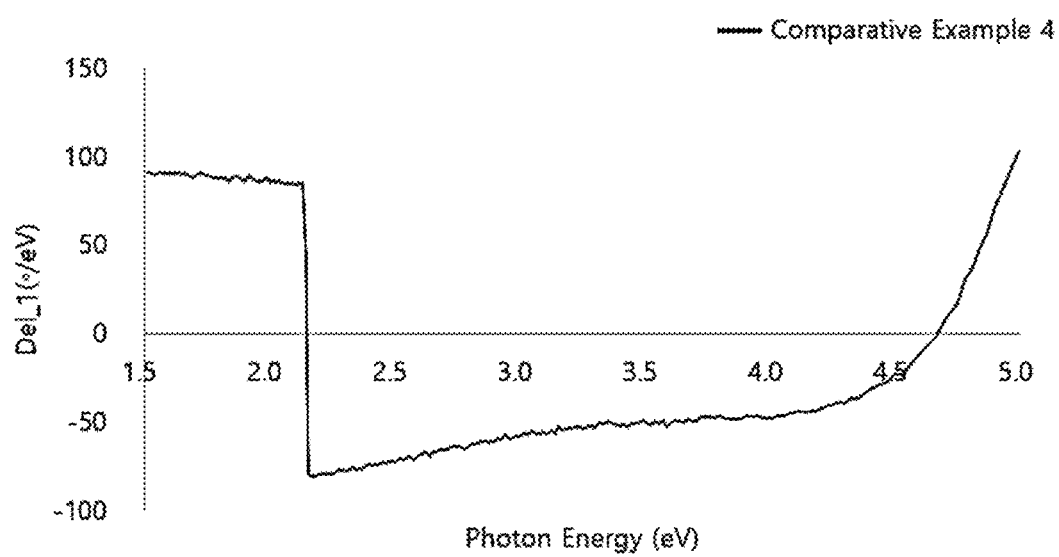
FIG. 21 is a graph of measuring distribution of Del_2 value depending on Photon energy of incident light of Comparative Examples 4.

In this application, the transmissive portion (TA) means a region on the surface of the photomask, which does not include a phase shift film and thereby transmits exposure light, and the semi-transmissive portion (NTA) means a region including the phase shift film and thereby transmits the attenuated exposure light (refer to FIG. 11).

A manufacturing process of a semiconductor device comprises a process of forming a designed pattern by forming a pattern on a semiconductor wafer through an exposure process. In detail, when a photomask comprising a designed pattern is disposed on a semiconductor wafer having a resist film applied to the surface thereof and then resist film is exposed through a light source, the resist film of the semiconductor wafer forms a designed resist pattern after treatment with a developing solution.

As semiconductors are highly integrated, more miniaturized circuit patterns are required. In order to form a miniaturized pattern on a semiconductor wafer, exposure light having a shorter wavelength than conventional exposure light may be applied. The exposure light for forming the miniaturized pattern comprises, for example, an ArF excimer laser (wavelength of 193 nm).

As circuit patterns become more miniaturized, films comprised in the photomask to form patterns are required to have improved optical properties.

In addition, a light source that generates exposure light having a short wavelength may require high optical power. Such a light source may increase the temperature of the photomask comprised in the semiconductor device manufacturing apparatus applied to exposure process.

The films comprised in the photomask to form the pattern may exhibit a characteristic in which physical properties such as thickness and height change according to temperature change. Films comprised in the photomask to form a pattern are required to have further reduced thermal variation characteristics.

The photomask may be formed by patterning a blank mask. Accordingly, the characteristics of the blank mask may affect the properties of the photomask. Also, in some cases, oxidation treatment, heat treatment, and the like are applied to a film of the blank mask during the manufacturing process of the blank mask, so that there is a difference between the characteristics of the film itself in the blank mask immediately after the film formation and the characteristics of the thin film in the completed blank mask.

Crystal characteristics of each layer comprised in the blank mask may be appropriately adjusted so that optical properties and thermal properties of each layer comprised in the blank mask may be improved.

The inventors of the present disclosure ascertained the follows through experiments and completed the example embodiments; it can be substantially suppressed that the degradation of resolution of a photomask caused from temperature increase due to a light source generating a exposure light with a short wavelength, or the difference in optical properties between respective films, by adjusting the crystal characteristics of the films comprised in the blank mask.

Hereinafter, example embodiments will be described in further detail.

Figure 1:
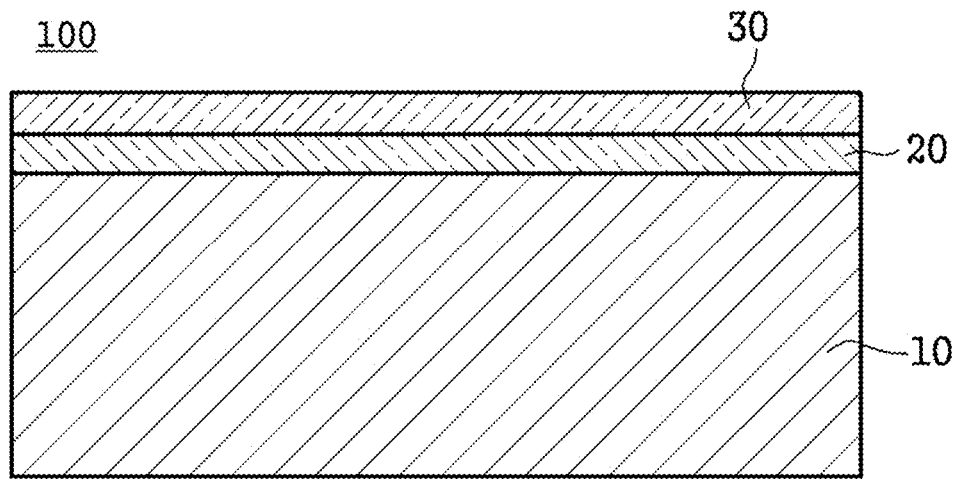
FIG. 1 is a sectional view for illustrating a blank mask according to one embodiment.

FIG. 1 is a sectional view for illustrating a blank mask according to one embodiment. The embodiment is described with reference to the FIG. 1.

The blank mask 100 comprises a transparent substrate 10, a phase shift film 20 disposed on the transparent substrate 10, and a light shielding layer 30 disposed on the phase shift film 20.

The material of the transparent substrate 10 is not limited as long as it has light transmittance to exposure light and can be applied to the photomask. Specifically, the transmittance of the transparent substrate 10 with respect to exposure light having a wavelength of 200 nm or less may be 85% or more. The transmittance may be 87% or more. The transmittance of the transparent substrate 10 with respect to ArF light may be 85% or more. The transmittance may be 87% or more. For example, the transparent substrate 10 may be a synthetic quartz substrate. In such a case, the transparent substrate 10 may suppress attenuation of light transmitting the transparent substrate 10.

In addition, the transparent substrate 10 may reduce the occurrence of optical distortion by adjusting surface characteristics such as flatness and roughness.

The phase shift film 20 may be disposed on an upper surface of the transparent substrate 10.

In the blank mask 100, the light shielding film 30 is disposed on the phase shift film. The light shielding layer 30 may be used as an etching mask for the phase shift film 20 when the phase shift film 20 is etched in a pattern shape. In addition, the light shielding film 30 may block transmission of the exposure light incident from the rear side of the transparent substrate 10.

Crystalline Properties of Phase Shift Film

A blank mask according to an embodiment comprises a transparent substrate; a phase shift film disposed on the transparent substrate; and a light shielding film disposed on at least some of the phase shift film.

The blank mask is analyzed by normal mode XRD (X-Ray Diffraction).

When the normal mode XRD analysis is performed on an upper surface of the phase shift film, the phase shift film has the XRD maximum peak at 2θ 15° to 30°.

When the normal mode XRD analysis is performed on a lower surface of the transparent substrate, the transparent substrate has the maximum peak at 2θ of 15° to 30°.

The AI1 value expressed by the Equation 1 below is 0.9 to 1.1.

$$AI1 = \frac{XM1}{XQ1} \qquad \text{[Equation 1]}$$

In the Equation 1, the XM1 is the maximum value of the measured X-ray intensity when the normal mode XRD analysis is performed on the upper surface of the phase shift film, and the XQ1 is the maximum value of measured X ray intensity when the normal mode XRD analysis is performed on the lower surface of the transparent substrate.

The optical properties of the phase shift film 20 are determined depending on various factors such as a composition of elements constituting the phase shift film 20, a film density, and a film thickness. Therefore, in order to maximize the resolution of the pattern to be developed on the semiconductor wafer, the phase shift film 20 is designed and then formed in consideration of the above factors.

Meanwhile, the temperature of the phase shift film 20 may increase due to heat generated from the light source during the exposure process, and the thickness value, stress, and the like of the phase shift film 20 may vary due to the heat.

For the thermal variation characteristics, the phase shift film 20 and the transparent substrate 10 may have different characteristics. This is considered to be because it is different from the transparent substrate 10 in the type of element, the content of each element, and the crystal structure comprised in the phase shift film 20. Such a difference may be a factor causing a decrease in resolution of the photomask. In detail, in repetitive exposure processes for long duration, the transparent substrate 10 and the phase shift film 20 may exhibit different dimensional variations and stress variations. For this reason, distortion of the optical path may occur, particularly at the interface between the transparent substrate 10 and the phase shift film 20.

The embodiment may reduce the optical distortion occurring at the interface between the transparent substrate 10 and the phase shift film 20 by controlling the crystal characteristics of the phase shift film 20 to be more similar to that of the transparent substrate 10.

By controlling factors such as the type of element constituting the phase shift film 20, the content of each element, the magnetic field strength in the sputtering process, the substrate rotation speed, the voltage applied to the target, the atmospheric gas composition, the sputtering temperature, and the conditions during the post-processing process, crystal characteristics of the phase shift film 20 may be adjusted.

In particular, the embodiment allows the plasma to be distributed over the entire surface of the target in the chamber by disposing a magnet in the sputtering equipment and forming a magnetic field when the phase shift film 20 is formed using the sputtering equipment. By controlling the distribution and strength of the magnetic field, it is possible to control the crystal characteristics of the phase shift film formed with sputtering equipment.

Figure 2:
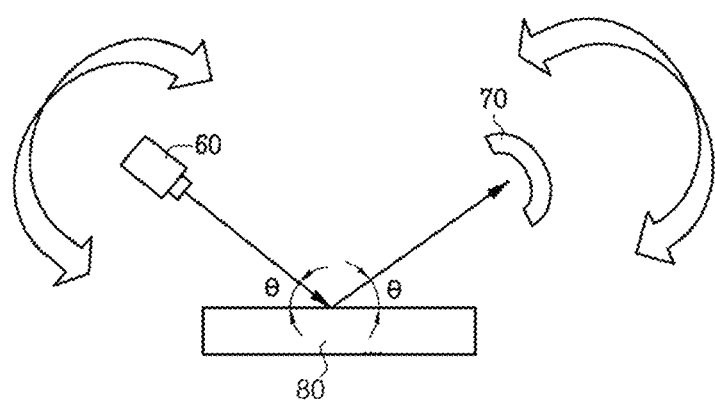
FIG. 2 is a schematic view for illustrating a process of normal mode XRD analysis.

FIG. 2 is a schematic view for illustrating a process of normal mode XRD analysis. An embodiment will be described with reference to FIG. 2.

Crystal characteristics of the phase shift film and the transparent substrate may be analyzed by X-ray diffraction (XRD) analysis.

Before XRD analysis is performed, the light shielding film disposed on the phase shift film is required to removed. When another film is placed between the phase shift film and the light shielding film, the other film is also required to removed. That is, the light shielding film is removed to expose the upper surface of the phase shift film. As a method of removing the thin film, etching may be exemplarily applied.

XRD analysis can be run in normal mode. The normal mode XRD analysis is in θ-2θ mode. In the normal mode XRD analysis, X-rays generated from the X-ray generator 60 are emitted to the sample 80, and the X-rays reflected from the sample 80 are detected through a detector 70.

At this time, the X-ray generator 60 emits X-rays to the sample 80 at a predetermined incident angle θ. The incident angle θ is an angle between the direction of the X-ray emitted from the X-ray generator 60 and the horizontal plane of the sample 80. In addition, the X-ray generator 60 emits X-rays to the sample 80 while changing the incident angle θ.

The detector 70 is disposed opposite to the location where the X-ray generator 60 is disposed based on the location where the X-rays are incident in a surface of the sample 80. Also, the detector 70 detects X-rays having a predetermined emission angle θ among the X-rays reflected from the sample 80. The emission angle θ is the angle between the direction of the X-ray reflected from the sample 80 and the horizontal plane of the sample 80.

In addition, the detector 70 moves in response to the scan direction of the X-ray generator 60. That is, when the X-ray generator 60 scans the sample 80, the detector 70 moves so that the incident angle θ and the emission angle θ are equal to each other. In the normal mode XRD analysis, the X-ray generator 60 and the detector 70 may move on the same plane so that the incident angle θ and the emission angle θ are equal to each other. In addition, the X-ray generator 60 may move so that the distance from the position where the X-rays of the sample 80 is incident is constant. In addition, the detector 70 may move so that the distance from the position where the X-rays of the sample 80 are reflected is constant. That is, the X-ray generator 60 and the detector 70 may be moved while drawing an arc.

In normal mode XRD analysis, an X-ray source may be a copper (Cu) target. In normal mode XRD analysis, the wavelength of X-rays may be about 1.542 nm. In normal mode XRD analysis, the voltage used to generate X-rays may be about 45 kV. In normal mode XRD analysis, the electric current used to generate X-rays may be about 200 mA. In normal mode XRD analysis, the measurement range of 2 θ may be from about 10° to about 100°. Normal mode XRD analysis can perform measurements at all times when the 2 θ is changed by 0.05°. In normal mode XRD analysis, the scan rate of the X-ray generator 60 and detector 70 may be about 5°/min.

Figure 3:
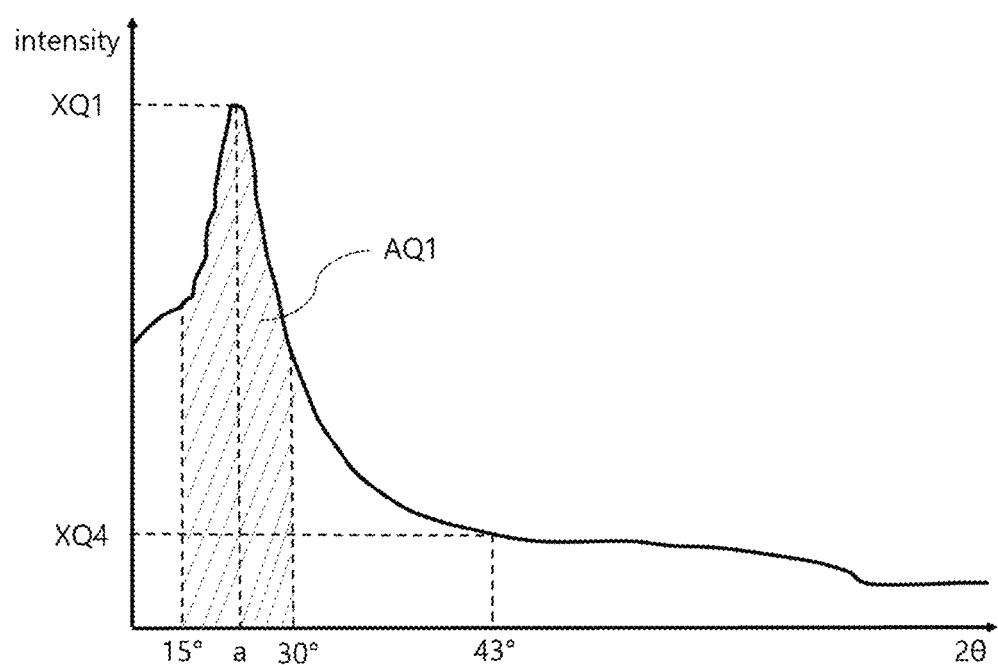
FIG. 3 is a conceptual view for illustrating an X ray intensity measured by performing normal mode XRD analysis to a phase shift film in a blank mask according to an embodiment.
Figure 4:
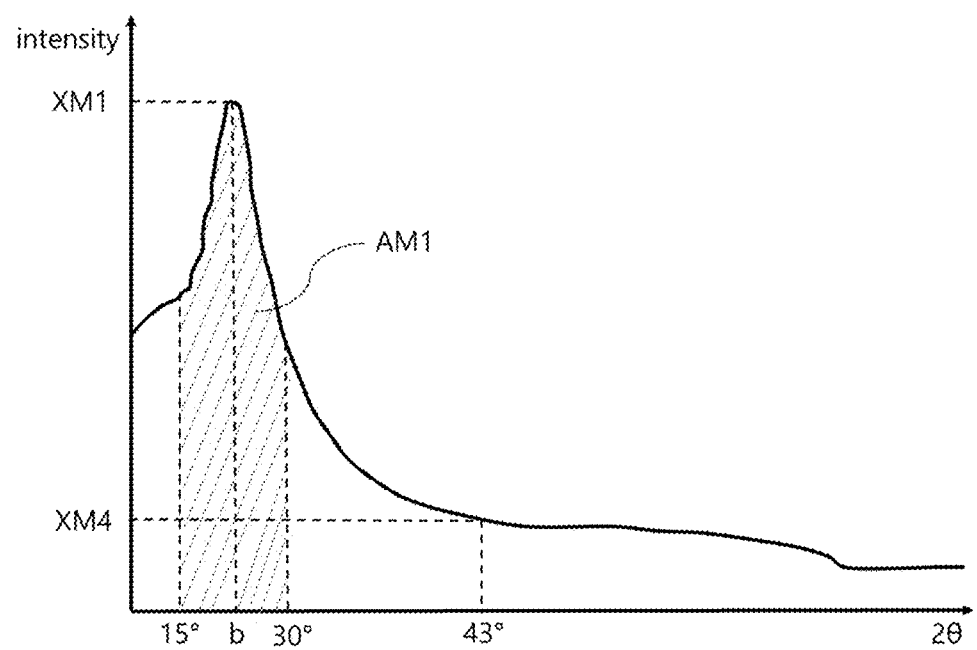
FIG. 4 is a conceptual view for illustrating an X ray intensity measured by performing normal mode XRD analysis to a transparent substrate in a blank mask according to an embodiment.

FIG. 3 is a conceptual view for illustrating an X ray intensity measured by performing normal mode XRD analysis to a phase shift film, in a blank mask according to one embodiment. FIG. 4 is a conceptual view for illustrating an X ray intensity measured by performing normal mode XRD analysis to a transparent substrate. An embodiment will be described with reference to the FIGS. 3 and 4.

When normal mode XRD analysis is performed on the upper surface of the phase shift film, 20 of the maximum peak of the measured X-ray intensity may be 15° to 30°. When normal mode XRD analysis is performed on the lower surface of the transparent substrate, 20 of the maximum peak of the X-ray intensity measured may be 15° to 30°.

Hereinafter, when the XRD analysis is performed in the phase shift film, it means that the XRD analysis is performed on the upper surface of the phase shift film of the blank mask, and XRD analysis is performed in the side of the phase shift film. Similarly, when the XRD analysis is performed on the transparent substrate, it means that the XRD analysis is performed on the lower surface of the transparent substrate, and it is also expressed that the XRD analysis is performed on the side of the transparent substrate.

When the normal mode XRD analysis is performed on the phase shift film, 2θ of the maximum peak of the measured X-ray intensity may be 20° to 25°. When normal mode XRD analysis is performed on the transparent substrate, 2 θ of the maximum peak of the measured X-ray intensity may be 20° to 25°.

In addition, the absolute value of difference between the 2θ of the maximum peak of the X-ray intensity measured from the phase shift film when the normal mode XRD analysis is performed on the phase shift film and the 2θ of the maximum peak of the X-ray intensity measured from the transparent substrate when the normal mode XRD analysis is performed on the transparent substrate may be 5° or less. The absolute value may be 3° or less. The absolute value may be 1° or less.

In the blank mask, the AI1 value of Equation 1 below may be 0.9 to 1.1.

$$AI1 = \frac{XM1}{XQ1} \quad \text{[Equation 1]}$$

Here, the XM1 is the maximum value of the X-ray intensity measured when the normal mode XRD analysis is performed on the front surface of the phase shift film, and the XQ1 is the maximum value of the X-ray intensity measured when the normal mode XRD analysis is performed on the lower surface of the transparent substrate.

The AI1 value may be 0.95 to 1.05. The AI1 value may be 0.97 to 1.03. The AI1 value may be 0.98 to 1.02. The AI1 value may be 0.99 to 1.01. In this case, it is possible to suppress a decrease in the resolution of the photomask due to a temperature change of long duration in the exposure process.

In the blank mask, the AI3 value expressed by Equation 3 below may be 0.9 to 1.1.

$$AI3 = \frac{AM1}{AQ1} \quad \text{[Equation 3]}$$

Here, the AM1 is the area of a region where 2θ is 15° to 30° in the X-ray intensity measured when XRD analysis is performed on the upper surface of the phase shift film, and the AQ1 is the area of the region where 2θ is 15° to 30° in the measured X-ray intensity XRD analysis on the lower surface of the transparent substrate.

The AI3 value may be 0.95 to 1.05. The AI3 value may be 0.97 to 1.03. The AI3 value may be 0.98 to 1.02. The AI3 value may be 0.99 to 1.01. In such a case, the difference in crystal characteristics between the transparent substrate and the phase shift film is reduced, and thus deterioration of the patterned phase shift film due to temperature change can be suppressed.

In the blank mask, an AI4 value expressed by Equation 4 below may be 0.9 to 1.1.

$$AI4 = \frac{XM4}{XQ4} \quad \text{[Equation 4]}$$

Here, the XM4 is the X-ray intensity where 2θ is 43° when the XRD analysis is performed on the upper surface of the phase shift film and, and the XQ4 is the X-ray intensity where 2θ is 43° when the XRD analysis is performed on the lower surface of the transparent substrate.

The AI4 value may be 0.95 to 1.05. The AI4 value may be 0.97 to 1.03. The AI4 value may be 0.98 to 1.02. The AI4 value may be 0.99 to 1.01.

In such a case, the difference in thermal variation characteristics between the transparent substrate and the phase shift film can be effectively reduced.

Figure 5:
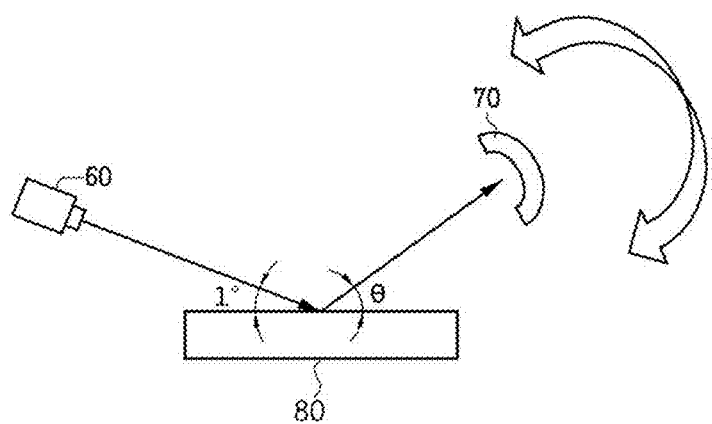
FIG. 5 is a schematic view for illustrating a process of fixed mode XRD analysis.

FIG. 5 is a schematic view for illustrating fixed mode XRD analysis. Hereinafter, an embodiment will be described with reference to FIG. 5.

The XRD analysis may proceed as a fixed mode XRD analysis. In the fixed mode XRD analysis, X-rays are generated from the X-ray generator 60 and emitted to the sample 80, and the X-rays reflected from the sample 80 are detected through the detector 70.

At this time, in the fixed mode XRD analysis, the X-ray generator 60 emits X-rays to the sample 80 at a fixed incident angle (eg, 1°). The incident angle is an angle between the direction of the X-rays emitted from the X-ray generator 60 and the horizontal plane of the sample 80.

The detector 70 is disposed opposite to the location where the X-ray generator 60 is disposed based on the location where the X-rays of the sample 80 are incident. Also, the detector 70 detects X-rays having a predetermined emission angle θ among the X-rays reflected from the sample 80. The emission angle θ is the angle between the direction of the X-ray reflected from the sample 80 and the horizontal plane of the sample 80.

The detector 70 may be moved to detect X-rays emitted at various emission angles θ. In the fixed mode XRD analysis, the position of the X-ray generator 60, the detector 70 and the site of the sample 80 to be measured are arranged in the same plane. Also, in the same plane, the detector 70 may move. In addition, the detector 70 may be moved so that the distance from the position where the X-rays are reflected from the sample 80 is constant. That is, the detector 70 may be moved while drawing an arc.

In the fixed mode XRD analysis, the incident angle is about 1°, the X-ray source is a copper target (Cu target), the wavelength of the X-ray is about 1.542 nm, the voltage used to generate the X-ray is about 45 kV, the current used to generate the X-rays is about 200 mA, the measurement range of 2θ is about 10° to about 100°, and the measurement is performed every time it changes about 0.05° based on 2θ, and, the scan rate of the detector 70 is about 5°/min.

Figure 6:
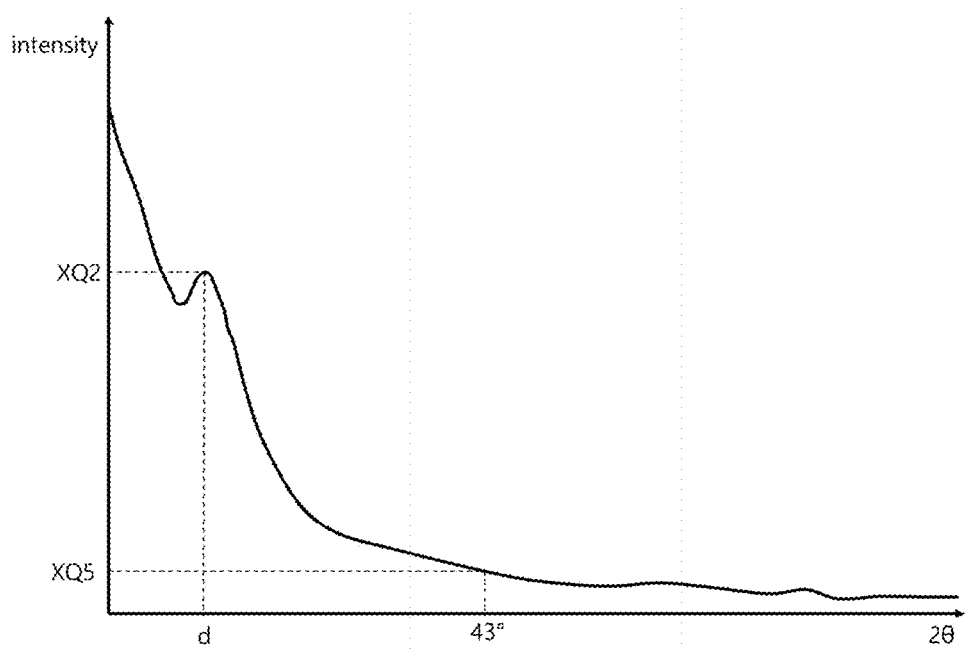
FIG. 6 is a conceptual view for illustrating an X ray intensity measured by performing fixed mode XRD analysis to a phase shift film in a blank mask according to one embodiment.
Figure 7:
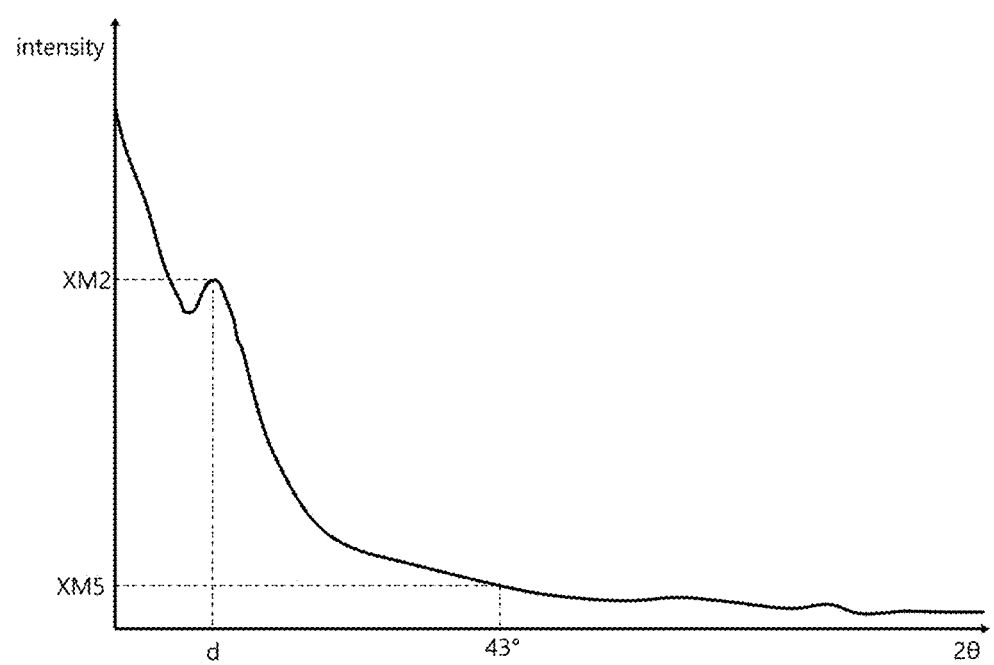
FIG. 7 is a conceptual view for illustrating an X ray intensity measured by performing fixed mode XRD analysis to a transparent substrate in a blank mask according to one embodiment.

FIG. 6 is a conceptual view for illustrating an X ray intensity measured by performing fixed mode XRD analysis to a phase shift film in a blank mask according to one embodiment. FIG. 7 is a conceptual view for illustrating an X ray intensity measured by performing fixed mode XRD analysis to a transparent substrate in a blank mask according to one embodiment. An embodiment will be described with reference to the FIGS. 6 and 7.

When the fixed mode XRD analysis is performed, 2θ of the first peak, which is the maximum peak of the X-ray intensity measured from the upper surface of the phase shift film, may be 15° to 25°. When the fixed mode XRD analysis is performed, 2θ of the second peak, which is the maximum peak of the X-ray intensity measured from the lower surface of the transparent substrate, may be 15° to 25°.

2θ of the first peak may be 17° to 23°, and 2θ of the second peak may be 17° to 23°.

2θ of the first peak may be 19° to 22°, and 2θ at the second peak may be 19° to 22°.

An absolute value of a difference between 2θ of the first peak and 2θ of the second peak may be 5° or less. The absolute value may be 3° or less. The absolute value may be 2° or less.

The blank mask may have an AI2 value of 0.9 to 1.1 expressed by Equation 2 below.

$$AI2 = \frac{XM2}{XQ2} \qquad \text{[Equation 2]}$$

Here, the XM2 is the intensity value of the first peak, and the XQ2 is the intensity value of the second peak.

The AI2 value may be 0.95 to 1.05. The AI2 value may be 0.97 to 1.03. The AI2 value may be 0.98 to 1.02. In such a case, optical distortion that may occur at the interface between the transparent substrate and the phase shift film can be suppressed.

Crystal Characteristics of Light Shielding Film

The light shielding layer may comprise a relatively high content of metal elements compared to other films comprised in the blank mask. For this reason, the light shielding film may have a relatively large dimensional variation in the thickness direction according to the temperature change compared to other films. When the light shielding layer is patterned to form a blind pattern together with the phase shift film, the shape of the patterned light shielding film may be deformed due to heat generated from a high-power light source for exposure. This may cause difficulties in developing a minute pattern on a semiconductor wafer precisely.

The example embodiment may provide a blank mask in which the shape deformation of the light-shielding pattern film is suppressed even in an exposure process performed repeatedly and for a long time by controlling the crystal characteristics of the light shielding film and the transparent substrate measured by XRD.

Figure 8:
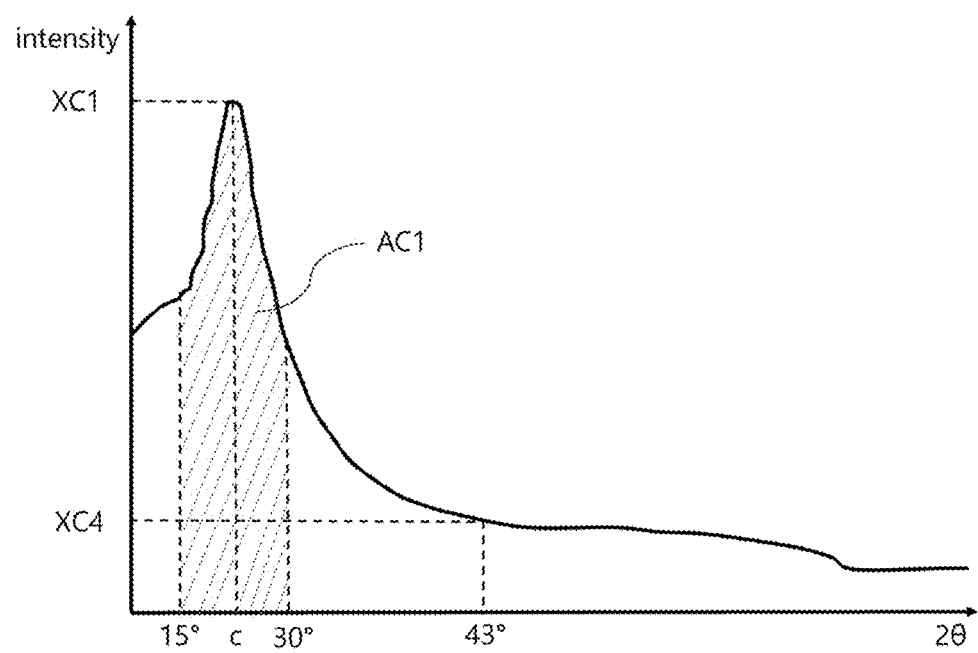
FIG. 8 is a conceptual view for illustrating an X ray intensity measured by performing fixed mode XRD analysis by performing normal mode XRD analysis to a light shielding film in a blank mask according to an embodiment.

FIG. 8 is a conceptual view for illustrating an X ray intensity measured by performing normal mode XRD analysis to a light shielding film in a blank mask according to an embodiment. An embodiment will be described with reference to FIG. 8.

When normal mode XRD analysis is performed on the upper surface of the light shielding film, 2θ of the maximum peak of the X-ray intensity measured may be 15° to 30°. When normal mode XRD analysis is performed on the lower surface of the transparent substrate, 2θ of the maximum peak of the measured X-ray intensity measured is 15° to 30°.

The blank mask may have an AI5 value of 0.5 to 0.97 expressed by Equation 5 below.

$$AI5 = \frac{XC1}{XQ1} \qquad \text{[Equation 5]}$$

Here, the XC1 is the intensity value of the maximum peak of X-ray intensity measured by normal mode XRD analysis on the upper surface of the light shielding film, and the XQ1 is the intensity value of the maximum peak of X-ray intensity measured by normal mode XRD analysis on the lower surface of the transparent substrate.

The AI5 value may be 0.7 to 0.97. The AI5 value may be 0.5 to 0.95. The AI5 value may be 0.7 to 0.95. The AI5 value may be 0.7 to 0.93. The AI5 value may be 0.9 to 0.93. In such a case, it is possible to suppress the shape deformation of the blind pattern due to the exposure process with a light of short wavelength.

The blank mask may have an AI6 value of 1.05 to 1.4 expressed by Equation 6 below.

$$AI6 = \frac{XC4}{XQ4} \qquad \text{[Equation 6]}$$

Here, the XC4 is an X-ray intensity value at 2θ of 43° when the normal mode XRD analysis is performed on the upper surface of the light shielding film, and the XQ4 is an X-ray intensity value at 2θp0 of 43° when the normal mode XRD analysis is performed on the lower surface of the transparent substrate.

The AI6 value may be 1.06 to 1.4. The AI6 value may be 1.07 to 1.4. The AI6 value may be 1.08 to 1.4. In such a case, it is possible to suppress the dimensional variation in the thickness direction of the light shielding film according to the temperature change.

Layer Structure of Phase shift Film

Figure 9:
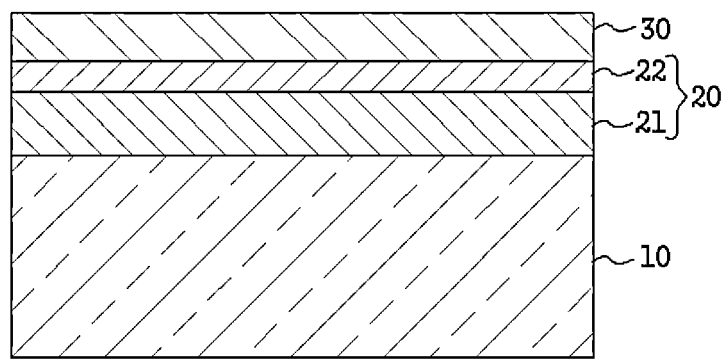
FIG. 9 is a sectional view for illustrating a blank mask according to another embodiment.

FIG. 9 is a sectional view for illustrating a blank mask according to another embodiment. An embodiment will be described with reference to FIG. 9.

The phase shift film 20 may comprise a phase difference adjustment layer 21 and a protective layer 22 disposed on the phase difference adjustment layer 21.

The phase shift film 20, the phase difference adjustment layer 21, and the protective layer 22 may comprise a transition metal, silicon, oxygen, and nitrogen.

The phase difference adjustment layer 21 is a layer in which the transition metal, silicon, oxygen, and nitrogen are uniformly comprised within the range of 5 atom % in the depth direction in the phase shift film 20. The phase difference adjustment layer 21 may substantially adjust the phase difference and transmittance of light transmitting the phase shift film 20.

In detail, the phase difference adjustment layer 21 has a characteristic of shifting the phase of the exposure light incident from the back side of the transparent substrate 10. Due to these characteristics, the phase shift film 20 effectively cancels the diffracted light generated at the edge of the transmissive portion in the photomask, so that the resolution of the photomask is further improved during the lithography process.

In addition, the phase difference adjustment layer 21 attenuates the exposure light incident from the back side of the transparent substrate 10. Through this, the phase shift film 20 may block the transmission of the exposure light while canceling the diffracted light generated at the edge of the transmissive portion.

The protective layer 22 is formed on the surface of the phase shift film, and is a layer having a distribution in which the oxygen content is continuously decreased in the depth direction from the surface and the nitrogen content is continuously increased. The protective layer 22 may improve the durability of the phase shift film 20 by suppressing damage to the phase shift film 20 or the patterned phase shift film in the etching process or cleaning process of the photomask. In addition, the protective layer 22 may suppress oxidation of the phase difference adjustment layer 21 due to exposure light in the exposure process.

Optical Properties of Phase shift Film Measured with Ellipsometer

In the blank mask, when the $PE_1$ value is 1.5 eV and the $PE_2$ value is 3.0 eV, the photon energy of incident light at the point where the Del_1 value is 0 according to Equation 7 below may be 1.8 eV to 2.14 eV.

$$\text{Del\_1} = \lim_{\Delta PE \to 0}\left(\frac{\Delta DPS}{\Delta PE}\right) \quad \text{[Equation 7]}$$

In the Equation 7, the DPS value is, when the light shielding film is removed from the blank mask and the surface of the phase shift film is measured with a spectroscopic ellipsometer by applying an incident angle of 64.5°, the phase difference between the P wave and the S wave of the reflected light if the phase difference between the P wave and the S wave of the reflected light is 180° or less, or a value obtained by subtracting the phase difference between the P wave and the S wave from 360° when the phase difference between the P wave and the S wave is more than 180°.

The PE value is the photon energy of the incident light within the range of the $PE_1$ value to the $PE_2$ value.

The resolution of the photomask can be improved by precisely adjusting the optical properties of the phase shift film 20.

In detail, the phase difference and transmittance with respect to the exposure light of the phase shift film 20 may be simultaneously adjusted. The phase difference and transmittance of the phase shift film 20 may be controlled by adjusting ingredients, thickness, and the like of the phase shift film. The thickness, transmittance and phase shift of the phase shift film 20 have characteristics that are related to each other. However, the phase difference and the transmittance have a trade-off relationship in which it is difficult to simultaneously have the intended values.

In the embodiment, by controlling the phase difference distribution of the P wave and S wave of the phase shift film measured with an ellipsometer, a phase shift film 20 which is further thinned and simultaneously having phase difference and transmittance for light with a wavelength of 200 nm or less controlled within the ranges preset in the embodiment.

Figure 10:
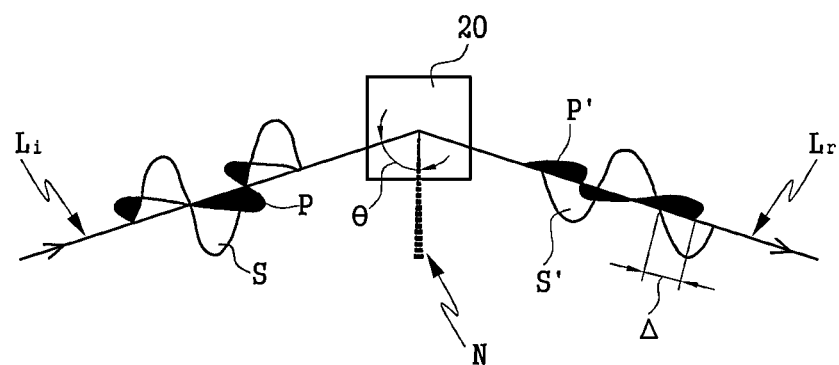
FIG. 10 is a conceptual view for showing principle for measuring a phase difference of P wave and S wave of reflected light of a phase shift film.

FIG. 10 is a conceptual view for showing a principle for measuring a phase difference between P wave and S wave of reflected light of a phase shift film with a spectroscopic ellipsometer. An embodiment will be described with reference to FIG. 10.

The phase difference (Δ) value between the P wave (P') and the S wave (S') of the reflected light (Lr) may vary depending on the photon energy of the incident light (Li) of the spectroscopic ellipsometer at a fixed angle of incidence (θ). The Del_1 value is calculated by measuring the phase difference (Δ) between the P wave (P') and the S wave (S') of the reflected light (Lr) with respect to the photon energy of the incident light (Li) of the phase shift film 20.

The Del_1 value distribution can be adjusted by controlling various factors such as elements constituting the phase shift film 20, the conditions of a sputtering process, the thickness of a phase shift film, and an incident angle set by a spectroscopic ellipsometer. In particular, the distribution of the Del_1 value of the phase shift film 20 may be controlled by adjusting the strength of a magnetic field applied to form the phase shift film 20.

The Del_1 value is measured with a spectroscopic ellipsometer. For example, the phase difference (Δ) between the P wave (P') and the S wave (S') of the reflected light (Lr) of the phase shift film may be measured through the MG-PRO model available from NANO-VIEW.

When the Del_1 value distribution of the phase shift film 20 is measured, the measurement is performed after the light shielding layer placed on the phase shift film 20 is removed. When another film is placed between the phase shift film 20 and the light shielding film, the other film is also removed. As methods for removing the light shielding film and the other films, an etching method and the like may be applied. However, the present application is not limited thereto. Since it is technically difficult to remove the other film placed on the phase shift film without damage to the phase shift film 20, damage of 1 nm or less in the thickness direction to the phase shift film during the etching process is allowed.

In the blank mask, when the $PE_1$ value is 1.5 eV and the $PE_2$ value is 3.0 eV, the photon energy of incident light at the point where the Del_1 value is 0 may be 1.8 eV to 2.14 eV. The photon energy of incident light may be 1.85 eV to 2.1 eV. The photon energy of incident light may be 1.9 eV to 2.05 eV. In this case, the phase shift film 20 may have a desired transmittance and a phase difference with respect to exposure light having a short wavelength, and may have a smaller thickness.

In the blank mask, when the $PE_1$ value is 3 eV and the $PE_2$ value is 5 eV, the photon energy of incident light at the point where the Del_1 value is 0 may be 3.8 to 4.64 eV.

When the incident light (Li) having high photon energy of incident light is irradiated to the measuring target, the incident light (Li) is reflected at a shallow depth from the surface or the surface of the phase shift film 20 due to the short wavelength of the incident light (Li). When the phase difference of reflected light formed by irradiating incident light (Li) with high photon energy to the surface of the phase shift film 20 is analyzed, the optical properties of the upper part of the phase shift film 20, especially the optical properties of the protective layer 22 can be ascertained.

The protective layer 22 is placed on the phase difference adjustment layer 21 to protect the phase difference adjustment layer 21 from exposure light and a cleaning solution. As the thickness of the protective layer 22 increases and the protective layer 22 has a dense structure, the protective layer 22 can more stably protect the phase difference adjustment layer 21. However, when the protective layer 22 is formed in consideration of only the stable protection of the phase difference adjustment layer 21, the optical property variation of the entire phase shift film 20 may occur quite significantly due to the effect of the formation of the protective layer 22. In such a case, the phase shift film 20 may have a characteristic that deviates from the originally designed optical properties. The embodiment can provide a phase shift film 20 in which a phase difference adjustment layer 21 is stably protected and the optical properties is not significantly varied compared to before the formation of the protective layer 22, by controlling the P wave and S wave distribution characteristics of the phase shift film 20.

When the $PE_1$ value is 3 eV and the $PE_2$ value is 5 eV, the photon energy distribution of incident light at the point where the Del_1 value is 0 can be adjusted by controlling factors such as the composition of atmospheric gas of sputtering, the annealing temperature, and the temperature increase rate during the annealing process of the phase difference adjustment layer 21. In particular, it is possible to control the Del_1 value by controlling the heat treatment temperature and time during the annealing process after UV light treatment on the surface of the phase difference adjustment layer 21.

In the blank mask 100, when the $PE_1$ value is 3 eV and the $PE_2$ value is 5 eV, the photon energy of incident light at the point where the Del_1 value is 0 may be 3.8 eV or more. The photon energy of incident light may be 4 eV or more. The photon energy of incident light may be 4.2 eV or more. The photon energy of incident light may be 4.3 eV or more. The photon energy of incident light may be 4.64 eV or less. The photon energy of incident light may be 4.62 eV or less. The photon energy of incident light may be 4.6 eV or less. In such a case, while the protective layer 22 sufficiently protects the phase difference adjustment layer 21, the optical property variation of the phase shift film 20 due to the formation of the protective layer 22 may be controlled within a predetermined range.

In the blank mask 100, when the $PE_1$ value is 1.5 eV and the $PE_2$ value is the minimum value within photon energy values of the incident light at the point where the Del_1 value is 0, the average value of Del_1 may be 78°/eV to 98°/eV.

When the photon energy of the incident light has a value within the range of 1.5 eV or more and less than or equal to the minimum value of the photon energy of the incident light at the point where the Del_1 value is 0, the incident light has a relatively long wavelength value. Since this incident light is reflected after being transmitted relatively deeply into the phase shift film, the average value of Del_1 measured by setting the photon energy of incident light in the same range as above shows the optical properties of the phase difference adjustment layer 21 in the phase shift film 20.

In the blank mask 100, when the $PE_1$ value is 1.5 eV and the $PE_2$ value is the minimum value within photon energy values of the incident light at the point where the Del_1 value is 0, the average value of the Del_1 value may be 78 to 98°/eV. The average value may be 80 to 95°/eV. The average value may be 82 to 93°/eV. In such a case, the phase difference adjustment layer 21 may help the phase shift film 20 to have a desired phase difference and transmittance for light of a short wavelength while having a relatively low thickness.

In the blank mask 100, when the $PE_1$ value is the minimum value within the photon energy values of the incident light at the point where the Del_1 value is 0, and the $PE_2$ value is the maximum value within the photon energy values of the incident light at the point where the Del_1 value is 0, the average value of Del_1 may be −65 to −55°/eV.

When the value of the photon energy of the incident light is greater than the minimum value within the photon energy values of the incident light at the point where the Del_1 value is 0, and the $PE_2$ value has a value within the range of less than or equal to the maximum value of the photon energy of the incident light at the point where the Del_1 value is 0, the average value of the Del_1 value measured by applying such a condition shows the optical properties of a portion located near the interface between the phase difference adjustment layer 21 and the protective layer 22.

In the blank mask 100, the $PE_1$ value is the minimum value within photon energy values of the incident light at the point where the Del_1 value is 0, and the $PE_2$ value is the maximum value within the photon energy values of the incident light at the point where the Del_1 value is 0, the average value of Del_1 may be −65 to −55°/eV. The average value may be −62 to −56°/eV. The average value may be −59 to −57°/eV. In such a case, it is possible to suppress the interface formed between the phase difference adjustment layer 21 and the protective film 22 from greatly affecting the optical properties of the entire phase shift film.

In the blank mask 100, the $PE_1$ value is the maximum value within photon energy values of the incident light at the point where the Del_1 value is 0, and when the $PE_2$ value is 5.0 eV, the average value of Del_1 may be 60 to 120°/eV.

The average value of Del_1 measured by setting the $PE_1$ value to be the maximum value within photon energy values of incident light at the point where the Del_1 value is 0 and the $PE_2$ value to be 5.0 eV shows the optical properties of the protective layer 22.

In the blank mask 100, when the $PE_1$ value is the maximum value within photon energy values of the incident light at the point where the Del_1 value is 0, and when the $PE_2$ value is 5.0 eV, the average value of the Del_1 value may be 60 eV to 120°/eV. The average value may be 70 to 110°/eV. The average value may be 80 to 105°/eV. In such a case, the phase shift film 20 may have stable durability while reducing the influence of the protective layer 22 on the optical properties of the entire phase shift film 20.

In the blank mask 100, when $PE_1$ value is 1.5 eV and $PE_2$ value is 3.0 eV, the absolute value of a difference value between a photon energy value of incident light which is measured after the formation of the protective layer 22 at the point where the Del_1 value is 0 and the photon energy value of the incident light measured before the formation of the protective layer 22 at the point where the Del_1 value is 0 may be 0.001 to 0.2 eV.

In the process of forming the protective layer 22 on the phase difference adjustment layer 21, a change in optical properties of the phase difference adjustment layer 21 itself may occur. In detail, when annealing is applied to the phase difference adjustment layer under controlled atmospheric pressure and temperature conditions, residual stress in the phase difference adjustment layer and the composition of the surface of the phase difference adjustment layer may be changed. Such variations may cause variations in the optical properties of the phase difference adjustment layer itself. This may cause the phase shift film to have characteristics deviating from the optical properties desired in the embodiment. The embodiment can provide a blank mask capable of exhibiting higher resolution by controlling the difference value of the optical properties of the phase difference adjustment layer itself before and after forming the protective layer.

In the blank mask 100, when $PE_1$ value is 1.5 eV and $PE_2$ value is 3.0 eV, the absolute value of a difference value between a photon energy value of incident light which is measured after the formation of the protective layer 22 at the point where the Del_1 value is 0 and the photon energy value of the incident light measured before the formation of the protective layer 22 at the point where the Del_1 value is 0 may be 0.001 to 0.2 eV. The absolute value may be 0.005 to 0.1 eV. The absolute value may be 0.01 to 0.008 eV. In such a case, a blank mask 100 may suppress optical variations of the phase difference adjustment layer 21 itself caused from the formation of the protective layer 22.

In the blank mask 100, when $PE_1$ value is 3.0 eV and $PE_2$ value is 5.0 eV, the absolute value of a difference value between a photon energy value of incident light which is measured after the formation of the protective layer 22 at the point where the Del_1 value is 0 and the photon energy value of the incident light measured before the formation of the protective layer 22 at the point where the Del_1 value is 0 may be 0.05 to 0.3 eV. The absolute value may be 0.06 to 0.25 eV. The absolute value may be 0.1 to 0.23 eV. In such a case, the blank mask 100 may reduce the influence of the optical properties of the protective layer 22 itself on the optical properties of the entire phase shift film 20.

In the blank mask 100, when the $PE_1$ value is 1.5 eV and the $PE_2$ value is 5.0 eV, the maximum value of Del_1 may be 105°/eV to 300°/eV.

In the embodiment, by adjusting the maximum value of Del_1 when the $PE_1$ value of the blank mask 100 is 1.5 eV and the $PE_2$ value is 5.0 eV, the phase shift film 20 can have stable durability while adjusting the optical property variation of the entire phase shift film 20 due to the formation of the protective layer 22 within a predetermined range.

In the blank mask 100, when the $PE_1$ value is 1.5 eV and the $PE_2$ value is 5.0 eV, the maximum value of Del_1 may be 105 to 300°/eV. The maximum value is 120 to 200 eV. The maximum value may be 140 to 160 eV. In such a case, the phase shift film 20 may have excellent light resistance, chemical resistance, and the like, while reducing the variation of the optical properties of the entire phase shift film 20 due to the formation of the protective layer 22.

In the blank mask 100, when the $PE_1$ value is 1.5 eV and the $PE_2$ value is 5.0 eV, the photon energy of incident light at the point where the Del_1 is the maximum value may be 4.5 eV or more.

When the $PE_1$ value is 1.5 eV and the $PE_2$ value is 5.0 eV, the maximum value of Del_1 is influenced by the optical properties of the protective layer 22 and the like. The embodiment can reduce the influence of the protective layer 22 on the optical properties of the entire phase shift film 20 while maintaining stable durability by adjusting the photon energy of incident light at the point having the maximum value of Del_1.

In the blank mask 100, when the $PE_1$ value is 1.5 eV and the $PE_2$ value is 5.0 eV, the photon energy of incident light at the maximum value of Del_1 may be 4.5 eV or more. The photon energy of incident light at the point where the Del_1 is the maximum value may be 4.55 eV or more. A photon energy of incident light at the point having the maximum value of Del_1 may be 5 eV or less. The photon energy of incident light at the point having the maximum value of Del_1 may be 4.8 eV or less. In such a case, the phase shift film 20 can exhibit desired optical properties with respect to light with a short wavelength, and at the same time can suppress optical property variations due to exposure and cleaning processes.

In the blank mask 100, when the $PE_1$ value is 1.5 eV and the $PE_2$ value is 5.0 eV, a value obtained by subtracting the minimum value of Del_1 from the maximum value of Del_1 may be 60 to 260 eV.

The inventors of the present disclosure ascertained the follows through experiments; when the $PE_1$ value is 1.5 eV and the $PE_2$ value is 5.0 eV, the maximum value of Del_1 shows the optical properties of the protective layer 22, and the minimum value of the Del_1 shows the optical properties of the upper portion of the phase difference adjustment layer 21.

When the $PE_1$ value is 1.5 eV and the $PE_2$ value is 5.0 eV, the maximum value of Del_1 and the minimum value of Del_1 may vary before and after the formation of the protective layer. When the value obtained by subtracting the minimum value of Del_1 from the maximum value of Del_1 is controlled within a predetermined range, optical property variation of the entire phase shift film 20 before and after formation of the protective layer 22 may occur within an allowable range.

In the blank mask, when the $PE_1$ value is 1.5 eV and the $PE_2$ value is 5.0 eV, a value obtained by subtracting the minimum value of Del_1 from the maximum value of Del_1 may be 60 to 260 eV. A value obtained by subtracting the minimum value of Del_1 from the maximum value of Del_1 may be 80 to 240 eV. A value obtained by subtracting the minimum value of Del_1 from the maximum value of Del_1 may be 90 to 230 eV. In such a case, the optical property variation of the entire phase shift film before and after formation of the protective layer may be controlled within a predetermined range.

Composition of Phase shift Film

The phase shift film 20 may comprise a transition metal, silicon, oxygen, and nitrogen. The transition metal may be one or more elements selected from molybdenum (Mo), tantalum (Ta), zirconium (Zr), and the like, but is not limited thereto. For example, the transition metal may be molybdenum.

The phase shift film 20 may comprise a transition metal of 1 to 10 atom %. The phase shift film 20 may comprise a transition metal of 2 to 7 atom %. The phase shift film 20 may comprise silicon in an amount of 15 to 60 atom %. The phase shift film 20 may comprise silicon in an amount of 25 to 50 atom %. The phase shift film 20 may comprise nitrogen in an amount of 30 to 60 atom %. The phase shift film 20 may comprise nitrogen in an amount of 35 to 55 atom %. The phase shift film 20 may comprise oxygen in an amount of 5 to 35 atom %. The phase shift film 20 may comprise oxygen in an amount of 10 to 25 atom %. In such a case, the phase shift film 20 may have optical properties suitable for a lithography process using exposure light having a short wavelength, specifically, light having a wavelength of 200 nm or less.

The phase shift film 20 may additionally comprise other elements in addition to the above-mentioned elements. For example, the phase shift film 20 may comprise argon (Ar), helium (He), or the like.

The phase shift film 20 may have different content for each element in the thickness direction.

The content distribution for each element formed in the depth direction of the phase difference adjustment layer 21 and the protective layer 22 may be ascertained by measuring a depth profile of the phase shift film 20. The depth profile of the phase shift film 20 may be measured using, for example, a K-alpha model available from THERMO SCIENTIFIC.

The phase difference adjustment layer 21 and the protective layer 22 may have different contents of each element, such as a transition metal, silicon, oxygen, and nitrogen.

The phase difference adjustment layer 21 may comprise a transition metal of 3 to 10 atom %. The phase difference adjustment layer 21 may comprise a transition metal of 4 to 8 atom %. The phase difference adjustment layer 21 may comprise silicon in an amount of 20 to 50 atom %. The phase difference adjustment layer 21 may comprise silicon in an amount of 30 to 40 atom %. The phase difference adjustment layer 21 may comprise oxygen in an amount of 2 to 10 atom %. The phase difference adjustment layer 21 may comprise oxygen in an amount of 3 to 8 atom %. The phase difference adjustment layer 21 may comprise nitrogen in an amount of 40 to 60 atom %. The phase difference adjustment layer 21 may comprise nitrogen in an amount of 45 to 55 atom %. In such a case, when exposure light having a short wavelength, specifically light having a wavelength of 200 nm or less, is applied as the exposure light, the blank mask may have excellent pattern resolution.

As the protective layer 22 comprises more oxygen, it is possible to stably protect the phase difference adjustment layer 21 from exposure light and a cleaning solution. However, such a protective layer 22 may have a greater effect on the optical property variation of the entire phase shift film 20 that occurs before and after the formation of the protective layer 22.

Accordingly, by controlling the content distribution of oxygen and nitrogen in the protective layer 22, the phase shift film 20 may have sufficient light resistance and chemical resistance while having desired optical properties in the embodiment.

The protective layer 22 may comprise nitrogen in an amount of 20 to 40 atom %. The protective layer 22 may comprise nitrogen in an amount of 25 to 35 atom %. The protective layer 22 may comprise oxygen in an amount of 10 to 50 atom %. The protective layer 22 may comprise oxygen in an amount of 20 to 40 atom %. The protective layer 22 may comprise silicon in an amount of 10 to 50 atom %. The protective layer 22 may comprise silicon in an amount of 20 to 40 atom %. The protective layer 22 may comprise a transition metal in an amount of 0.5 to 5 atom %. The protective layer 22 may comprise a transition metal in an amount of 1 to 3 atom %. In such a case, the protective layer 22 can sufficiently suppress the deterioration of the phase difference adjustment layer 21.

The protective layer 22 may comprise a region in the thickness direction in which the nitrogen content (atom %) to the oxygen content (atom %) is 1 or more. The region may have a thickness of 40 to 60% of a total thickness of the protective layer 22. The region may have a thickness of 45 to 55% of a total thickness of the protective layer 22. In such a case, it is possible to effectively suppress variations in the optical properties of the phase shift film 20 due to the formation of the protective layer 22.

The protective layer 22 may comprise a region in which the ratio of the nitrogen content (atom %) to the oxygen content (atom %) in the thickness direction is 0.4 to 2, and the region may have a thickness of 30 to 80% compared to a total thickness of the protective layer 22. The region may have a thickness of 40 to 60% compared to a total thickness of the protective layer 22. In such a case, it is possible to provide a blank mask capable of manufacturing a photomask having excellent resolution while having sufficient long-term durability.

The thickness of the region in which the ratio of the nitrogen content (atom %) to the oxygen content (atom %) in the thickness direction is adjusted may be ascertained by measuring the depth profile. However, it is assumed that the etching rate for each depth of the protective layer 22 is constant in the depth profile when the thickness of the region is measured.

Optical Properties and Thickness of Each Layer of Phase shift Film

The phase shift film 20 may have a phase difference of 160 to 200° with respect to light having a wavelength of 200 nm or less. The phase shift film 20 may have a phase difference of 160 to 200° with respect to ArF light. The phase shift film 20 may have a phase difference of 170 to 190° with respect to light having a wavelength of 200 nm or less. The phase shift film 20 may have a phase difference of 170 to 190° with respect to ArF light. The phase shift film 20 may have a transmittance of 3 to 10% for light having a wavelength of 200 nm or less. The phase shift film 20 may have a transmittance of 3 to 10% for ArF light. The phase shift film 20 may have a transmittance of 4 to 8% for light having a wavelength of 200 nm or less. The phase shift film 20 may have a transmittance of 4 to 8% for ArF light. In such a case, the photomask comprising the phase shift film 20 may form a more precise minute pattern on the wafer in an exposure process to which exposure light of a short wavelength is applied.

The protective layer 22 may have a refractive index of 1.3 to 2 for light having a wavelength of 200 nm or less. The protective layer 22 may have a refractive index of 1.3 to 2 for ArF light. A refractive index of the protective layer 22 with respect to light having a wavelength of 200 nm or less may be 1.4 to 1.8. A refractive index of the protective layer 22 with respect to ArF light may be 1.4 to 1.8. An extinction coefficient for light having a wavelength of 200 nm or less of the protective layer 22 may be 0.2 to 0.4. An extinction coefficient for ArF light of the protective layer 22 may be 0.2 to 0.4. The protective layer 22 may have an extinction coefficient of 0.25 to 0.35 for light having a wavelength of 200 nm or less. An extinction coefficient of the protective layer 22 with respect to ArF light may be 0.25 to 0.35. In such a case, the optical property variation of the phase shift film 20 due to the formation of the protective layer 22 may be minimized.

The phase difference adjustment layer 21 may have a refractive index of 2 to 4 for light having a wavelength of 200 nm or less. The phase difference adjustment layer 21 may have a refractive index of 2 to 4 for ArF light. The refractive index of the phase difference adjustment layer 21 with respect to light having a wavelength of 200 nm or less may be 2.5 to 3.5. The refractive index of the phase difference adjustment layer 21 with respect to ArF light may be 2.5 to 3.5. An extinction coefficient for light having a wavelength of 200 nm or less of the phase difference adjustment layer 21 may be 0.3 to 0.7. The extinction coefficient for ArF light of the phase difference adjustment layer 21 may be 0.3 to 0.7. An extinction coefficient for light having a wavelength of 200 nm or less of the phase difference adjustment layer 21 may be 0.4 to 0.6. The extinction coefficient for ArF light of the phase difference adjustment layer 21 may be 0.4 to 0.6. In such a case, the resolution of the photomask comprising the phase shift film 20 may be further improved.

The optical properties of the phase shift film 20, the protective layer 22, and the phase difference adjustment layer 21 may be measured using a spectroscopic ellipsometer. For example, the optical properties may be measured through MG-PRO equipment of NANO-VIEW.

A ratio of the thickness of the protective layer 22 to a total thickness of the phase shift film 20 may be 0.04 to 0.09. The thickness ratio may be 0.05 to 0.08. In such a case, the protective layer 22 may stably protect the phase difference adjustment layer 21.

The thickness of the protective layer 22 may be 25 Å or more and 80 Å or less. The thickness of the protective layer 22 may be 35 Å or more and 45 Å or less. In such a case, it is possible to provide the phase shift film 20 that effectively reduces the degree of change in optical properties on the entire phase shift film and exhibits stable optical properties even in an exposure process and a cleaning process long-duration.

The phase shift film 20 and the thickness of each layer constituting the phase shift film 20 may be measured through a TEM image of a cross section of the phase shift film 20.

Layer Structure, Composition and Optical Properties of Light Shielding Film

The light shielding film 30 may be disposed on the phase shift film 20. The light shielding layer 30 may be used as an etching mask of the phase shift film 20 when the phase shift film 20 is etched according to a previously designed pattern shape. In addition, the light shielding film 30 may block transmission of the exposure light incident from the rear side of the transparent substrate 10.

The light shielding film 30 may have a single-layer structure. The light shielding film 30 may have a multi-layer structure of two or more films. In the light shielding film 30 sputtering process, multi-layer light shielding films 30 may be formed by applying different atmospheric gas compositions and flow rates for each layer in the light shielding film. In the light shielding film 30 sputtering process, multi-layer light shielding films 30 may be formed by applying different sputtering targets for each layer in the light shielding film.

The light shielding layer 30 may comprise chromium, oxygen, nitrogen, and carbon. The content of each element in the light shielding film 30 may be different in the thickness direction of the light shielding layer 30. In a case of a light shielding film with plural layers, the respective layers in the light shielding film 30 may have different compositions each other.

The light shielding layer 30 may comprise chromium in an amount of 30 to 70 atom %. The light shielding layer 30 may comprise chromium in an amount of 47 to 57 atom %. The light shielding film 30 may comprise carbon in an amount of 5 to 30 atom %. The light shielding layer 30 may comprise carbon in an amount of 7 to 25 atom %. The light shielding layer 30 may comprise nitrogen in an amount of 3 to 30 atom %. The light shielding layer 30 may comprise nitrogen in an amount of 5 to 25 atom %. The light shielding layer 30 may comprise oxygen in an amount of 20 to 55 atom %. The light shielding layer 30 may comprise oxygen in an amount of 25 to 40 atom %. In such a case, the light shielding film 30 may have sufficient extinction characteristics.

The multilayer film (not shown) comprises a phase shift film 20 and a light shielding film 30. The multilayer film may form a blind pattern on the transparent substrate 10 to suppress transmission of the exposure light.

The optical density of the multilayer film with respect to light having a wavelength of 200 nm or less may be 3 or more. The optical density of the multilayer film for ArF light may be 3 or more. The optical density of the multilayer film for light having a wavelength of 200 nm or less may be 3.5 or more. The optical density of the multilayer film for ArF light may be 3.5 or more. In such a case, the multilayer film may have excellent light blocking properties.

Manufacturing Method of Phase Shift Film

The phase difference adjustment layer among the phase shift films of the embodiment may be manufactured by sputtering on a transparent substrate.

The sputtering process may use DC power or RF power.

A target and a sputtering gas may be selected in consideration of the composition of the phase shift film to be formed.

In the case of a sputtering target, one target comprising a transition metal and silicon may be applied, and a target comprising a transition metal and a target comprising silicon may be applied simultaneously. When a target is applied as a sputtering target, the transition metal content relative to the sum of the transition metal and silicon contents of the target may be 30% or less. The transition metal content relative to the sum of the transition metal and silicon content of the target may be 20% or less. The transition metal content relative to the sum of the transition metal and silicon content of the target may be 10% or less. The transition metal content relative to the sum of the transition metal and silicon content of the target may be 2% or more. In such a case, the phase shift film formed by sputtering applied to the target may have desired optical properties.

In a case of the sputtering gas, $CH_4$ as a gas comprising carbon, $O_2$ as a gas comprising oxygen, $N_2$ as a gas comprising nitrogen, etc., may be introduced. However, the present disclosure is not limited thereto. An inert gas may be added to the sputter gas. Examples of the inert gas comprise Ar, He, and the like. However, the present application is not limited thereto. Depending on the type and content of the inert gas, the crystal characteristics of the phase shift film formed by sputtering may be adjusted. The sputtering gas may be individually introduced into the chamber for each gas. The sputtering gas may be introduced into the chamber by mixing respective gases.

A magnet may be disposed at the chamber so that the phase shift film has more uniformized crystal characteristics in the in-plane direction. In detail, by disposing the magnet on the back side of the sputtering target and rotating the magnet at a predetermined speed, plasma can be maintained at an even distribution on the front surface of the target. The magnet can be rotated at a speed of 50 to 200 rpm.

The rotation speed of the magnet may be fixed at a constant speed during sputtering. The rotation speed of the magnet can be varied during sputtering. The rotation speed of the magnet may be increased from the initial rotation speed with uniform acceleration during sputtering.

The rotation speed of the magnet may be increased by 5 to 20 rpm per minute from the initial rotation speed during sputtering. The rotation speed of the magnet may be increased by 7 to 15 rpm per minute from the initial rotation speed during sputtering. In such a case, film quality characteristics of the phase shift film in the thickness direction can be more easily controlled.

When the magnetic field of the magnet is adjusted, the density of plasma formed in the chamber is adjusted, thereby controlling the crystal characteristics of the phase shift film to be formed. The magnetic field of the magnet applied during sputtering may be 25 to 60 mT. The magnetic field may be 30 to 50 mT. In such a case, the phase shift film 20 to be formed may have crystal characteristics more similar to those of the transparent substrate.

In the sputtering process, the T/S distance, which is the distance between the target and the substrate, and the angle between a surface of the substrate and the front surface of the target may be adjusted. The T/S distance may be 240 to 260 mm. The angle between the surface of the substrate and the front surface of the target may be 20 to 30 degrees. In such a case, the formation rate of the phase shift film is stably controlled, and it is possible to suppress an excessive increase in the internal stress of the phase shift film.

In the sputtering process, the rotation speed of the substrate having the target surface for the phase shift film formation can be adjusted. The rotation speed of the substrate may be 2 to 20 RPM. The rotation speed of the substrate may be 5 to 15 RPM. When the rotation speed of the substrate is adjusted within such a range, the formed phase shift film may have stable durability while further improving the evenness of optical properties in the in-plane direction.

In addition, it is possible to adjust the intensity of power applied to the sputtering target when the phase difference adjustment layer is formed. By supplying power to the sputtering target, a discharge region including a plasma atmosphere in the chamber may be formed. The crystal characteristics of the phase shift film to be formed may be adjusted by controlling the electric power and simultaneously controlling the magnetic field and rotation speed of the magnet. The intensity of electric power applied to the sputtering target may be 1 to 3 kW. The intensity of the electric power may be 1.5 to 2.5 kW. The intensity of the electric power may be 1.8 to 2.2 KW. In such a case, the thermal variation in the thickness direction depending on the temperature of the phase shift film may be controlled within a predetermined range.

A spectroscopic ellipsometer may be installed in the sputtering equipment. Through this, it is possible to control the formation time while monitoring the optical properties of the phase difference adjustment layer 21 to be formed. In detail, after setting the angle formed by the incident light with the surface of the phase difference adjustment layer to be formed, it is possible to monitor the Del_1 value of the phase difference adjustment layer 21 formed in real time during the film formation process. By performing the film forming process until the Del_1 value falls within the range preset in the embodiment, the phase shift film may have desired optical properties.

By measuring the phase difference between the P wave and S wave of the reflected light while changing the photon energy of the incident light of the spectroscopic ellipsometer, the optical properties of each layer of the phase shift film can be measured. In detail, when the photon energy of the incident light is set to be relatively low, the incident light forms a long wavelength, so that the optical properties of the lower layer of the phase shift film to be measured can be measured. When the photon energy of the incident light is set to be relatively high, the incident light forms a short wavelength, so that the optical properties of the upper layer of the phase shift film to be measured can be measured.

UV light may be irradiated to the surface of the phase difference adjustment layer immediately after the sputtering process is completed. In the sputtering process, Si of the $SiO_2$ matrix constituting the transparent substrate may be substituted with a transition metal, and O of the $SiO_2$ matrix may be substituted with N. If the sputtering process is continued, it is out of the Solubility Limit of transition metal, and the transition metal may be disposed in an interstitial site rather than being substituted with Si in the $SiO_2$ matrix. In such a case, the transition metal may form a mixture with elements such as Si, O, and N. The mixture may be in a homogeneous state or may be in an inhomogeneous state.

When a non-uniform mixture is formed on the surface of the phase difference adjustment layer, a haze defect may be formed on the surface of the phase difference adjustment layer by exposure light having a short wavelength in the exposure process. When the cleaning process is performed using sulfuric acid as a cleaning solution to remove the haze, sulfur ions may remain on the surface of the phase difference adjustment layer after the cleaning process. Residual sulfur ions may continuously receive strong energy from exposure light in the wafer exposure process. Sulfur ions with high energy may react with the inhomogeneous mixture to generate growth defects on the surface of the phase difference adjustment layer. The embodiment can further improve the light resistance and chemical resistance of the phase difference adjustment layer by irradiating UV light of a controlled wavelength to the surface of the phase difference adjustment layer to uniformize the transition metal and N content in the mixture of the surface of the phase difference adjustment layer in the in-plane direction.

By using a light source having a power of 2 to 10 $mW/cm^2$, a light with a wavelength of 200 nm or less is irradiated to the surface of the phase difference adjustment layer for 5 to 20 minutes, and thereby the surface of the phase difference adjustment layer may be treated.

The phase difference adjustment layer 21 may be heat-treated together with or separately from the UV light irradiation process. The heat treatment may be applied by utilizing the heat generated by UV irradiation or may be performed as separated processes.

The phase difference adjustment layer 21 formed through the sputtering process may have an internal stress. The internal stress may be a compressive stress or a tensile stress depending on the conditions of sputtering. The internal stress of the phase difference adjustment layer may cause warpage of the substrate, and as a result, the resolution of the photomask to which the phase difference adjustment layer is applied may be reduced. In the embodiment, the warpage of the substrate may be reduced by applying a heat treatment to the phase difference adjustment layer.

The protective layer may be formed through a heat treatment process after sputtering process of the phase difference. During the heat treatment process, an atmospheric gas in the chamber may be introduced to form a protective layer on the surface of the phase difference adjustment layer 21. A protective layer may be formed by reacting the surface of the phase difference adjustment layer with atmospheric gas in the heat treatment process. However, the manufacturing method of the protective layer is not limited thereto.

The heat treatment process may comprise a temperature increasing operation, a temperature maintaining operation, a cooling operation, and a protective layer forming operation. The heat treatment process may be performed by disposing a blank mask having a phase difference adjustment layer formed on the surface thereof in a chamber and then heating it through a lamp.

In the temperature increasing operation, the atmosphere temperature in the heat treatment chamber may be raised to a set temperature of 150 to 500° C.

In the temperature maintaining operation, the atmosphere temperature in the chamber may be maintained at the set temperature, and the pressure in the chamber may be adjusted to be 0.1 to 2.0 Pa. The temperature maintaining operation may be carried out for 5 to 60 minutes.

In the cooling operation, the temperature in the chamber may be lowered from a set temperature to room temperature.

The protective layer forming operation is an operation of forming a protective layer on the surface of the phase shift film by introducing an atmospheric gas comprising a reactive gas into the chamber after the cooling operation is completed. The reactive gas may comprise $O_2$. The gas introduced into the chamber in the operation for forming a protective layer may comprise at least one of $N_2$, Ar, and He. Specifically, in the operation for forming a protective layer, $O_2$ gas may be introduced into the chamber at 0.3 to 2.5 SLM (Standard Liter per Minute). The O2 gas may be introduced into the chamber at 0.5 to 2 SLM. The operation for forming a protective layer may be performed for 10 to 60 minutes. The operation for forming a protective layer may be performed for 12 to 45 minutes. In such a case, the content of each element of the protective layer in the thickness direction may be adjusted to suppress variations in optical properties of the entire phase shift film caused from the formation of the protective layer.

Manufacturing Method of Light shielding Film

The light shielding film of the embodiment may be formed in contact with the phase shift film or may be formed in contact with another thin film placed on the phase shift film.

The light shielding layer may comprise a lower layer and an upper layer positioned on the lower layer.

The sputtering process may use DC power or RF power.

In consideration of the composition of the light shielding film, a sputtering target and a sputtering gas may be selected during sputtering of the light shielding film. When the light shielding film comprises two or more layers, the type and flow rate of the sputtering gas applied during sputtering for each layer may be applied differently.

In the case of a sputtering target, one target comprising chromium may be applied, and two or more targets comprising at least one of the targets comprising chromium may be applied. The target may comprise chromium in an amount of 90 atom % or more. The target may comprise chromium in an amount of 95 atom % or more. The target may comprise chromium in an amount of 99 atom % or more.

The type and flow rate of the sputtering gas may be adjusted in consideration of the composition of elements constituting each layer of the light shielding film, crystal characteristics of the light shielding film, optical properties, and the like.

The sputtering gas may comprise a reactive gas and an inert gas. Depending on the type and content of the reactive gas in the sputtering gas, the optical properties and crystal characteristics of the light shielding film to be formed may be controlled. The reactive gas may comprise $CO_2$, $O_2$, $N_2$ and $NO_2$, and the like. The reactive gas may further comprise other gases in addition to the above gas.

Depending on the type and content of the inert gas comprised in the sputtering gas, it is possible to control the crystal characteristics of the light shielding film to be formed. The inert gas may comprise Ar, He, Ne, and the like. The inert gas may further comprise other gases in addition to the above gas.

When the lower layer of the light shielding layer is formed, a sputtering gas comprising Ar, $N_2$, He and $CO_2$ may be injected into the chamber. Specifically, a sputtering gas in which the sum of the flow rates of $CO_2$ and $N_2$ is 40% or more compared to the total flow rate of the sputtering gas may be injected into the chamber.

When the upper layer of the light shielding layer is formed, a sputtering gas comprising Ar and $N_2$ may be injected into the chamber. Specifically, a sputtering gas in which a flow rate of $N_2$ is 30% or more compared to the total flow rate of the sputtering gas may be injected into the chamber.

In such a case, the light shielding film may have desired crystal characteristics in the embodiment.

Each gas constituting the sputtering gas may be mixed and injected into the sputtering chamber. Each gas constituting the sputtering gas may be individually injected through different inlets in the sputtering chamber for each type.

A magnet may be disposed at the chamber to control the in-plane uniformity of crystal characteristics and in-plane optical properties of the light shielding film to be formed. In detail, by disposing the magnet on the back side of the sputtering target and rotating the magnet at a speed within a range preset in the embodiment, plasma may be relatively uniformly distributed over the target front surface. When each layer of the light shielding film is formed, the magnet may be rotated at a speed of 50 to 200 rpm.

In the sputtering process, the T/S distance, which is the distance between the target and the substrate, and the angle between the surface of the substrate and the surface of the target may be adjusted. When each layer of the light shielding film is formed, the T/S distance may be 240 to 300 mm. The angle between the surface of the substrate and the surface of the target may be 20 to 30 degrees. In such a case, the film formation speed of the light shielding film is stably controlled, and an excessive increase in internal stress of the light shielding film can be suppressed.

In the sputtering process, the rotation speed of the substrate having the film-forming target surface can be adjusted. The rotation speed of the substrate may be 2 to 50 RPM. The rotation speed of the substrate may be 10 to 40 RPM. When the rotation speed of the substrate is adjusted within this range, the light shielding film may exhibit reduced dimensional variation characteristics in an exposure process for long duration.

In addition, it is possible to adjust the intensity of the electric power applied to the sputtering target when the light shielding film is formed. A discharge region comprising a plasma atmosphere in the chamber may be formed by supplying electric power to a target located in the sputtering chamber. By adjusting the intensity of the electric power, it is possible to control the plasma atmosphere in the chamber together with controlling magnetic field. Through this, it is possible to control the crystal characteristics of the light shielding film formed by sputtering.

The intensity of electric power applied to the sputtering target during the formation of the lower layer of the light shielding layer may be 0.5 to 2 kW. The intensity of the electric power may be 1.0 to 1.8 kW. The intensity of the electric power may be 1.2 to 1.5 kW. The intensity of the electric power applied to the sputtering target during the formation of the upper layer of the light shielding film may be 1 to 3 kW. The intensity of the electric power may be 1.3 to 2.5 kW. The intensity of the electric power may be 1.5 to 2.0 kW. In such a case, it is possible to effectively prevent the resolution of the photomask from being deteriorated due to the thermal variation of the light shielding film.

A spectroscopic ellipsometer may be installed in the sputtering equipment. Through this, it is possible to control the film formation time while monitoring the optical properties of the light shielding film to be formed. The method of measuring the optical properties of the light shielding film after installing a spectroscopic ellipsometer on the sputtering equipment when the light shielding film is formed is omitted because it is overlapped with the formation of the phase shift film.

When the lower layer of the light shielding film is formed, sputtering may be performed until the photon energy of incident light becomes 1.6 to 2.2 eV at the point where the phase difference between the P wave and the S wave of the reflected light measured by a spectroscopic ellipsometer is 140°. When the lower layer of the light shielding film is formed, sputtering may be performed until the photon energy of incident light becomes 1.8 to 2.0 eV at the point where the phase difference between the P wave and the S wave of the reflected light measured by a spectroscopic ellipsometer is 140°.

When the upper layer of the light shielding film is formed, sputtering can be performed until the photon energy of incident light becomes 1.7 to 3.2 eV at the point where the phase difference between the P wave and the S wave of the reflected light measured by a spectroscopic ellipsometer is 140°. When the upper layer of the light shielding film 30 is formed, sputtering may be performed until the photon energy of incident light at the point where the phase difference between the P wave and the S wave of the reflected light measured by a spectroscopic ellipsometer is 140° becomes 2.5 to 3.0 eV.

In such a case, the formed light shielding film may be comprised in the blind pattern of the photomask to effectively block the exposure light.

Photomask

FIG. 11 is a sectional view for illustrating a photomask according to another embodiment. An embodiment is described with reference to the FIG. 11.

A photomask 200 according to another embodiment of the present application comprises a transparent substrate 10; a phase shift film 20 disposed on the transparent substrate 10; and a light shielding film 30 disposed on at least some of the phase shift film 20.

The photomask 200 is analyzed by normal mode XRD (X-Ray Diffraction).

When the normal mode XRD analysis is performed on the upper surface of the phase shift film, the phase shift film has the XRD maximum peak at 2θ of 15° to 30°.

When the normal mode XRD analysis is performed on the lower surface of the transparent substrate, the transparent substrate has the XRD maximum peak at 2θ of 15° to 30°.

The AI1 value represented by Equation 1 below is 0.9 to 1.1.

$$AI1 = \frac{XM1}{XQ1} \quad \text{[Equation 1]}$$

In the Equation 1, the XM1 is the maximum value of the measured X-ray intensity when the normal mode XRD analysis is performed on the upper surface of the phase shift film.

The XQ1 is the maximum value of the measured X-ray intensity when the normal mode XRD analysis is performed on the lower surface of the transparent substrate.

The photomask may be manufactured using the blank mask described above. In detail, the photomask may be manufactured by patterning the phase shift film and the light shielding film of the blank mask.

Descriptions of thermal variation characteristics and optical properties of the phase shift film and the light shielding film is overlapped with the descriptions of the thermal variation characteristics and optical properties of the phase shift film and the light shielding film, and thus will be omitted.

A photomask according to another embodiment of the present disclosure comprises a transparent substrate, a phase shift film disposed on the transparent substrate, and a light shielding film disposed on the phase shift film.

In the photomask, when the $PE_1$ value is 3.0 eV and the $PE_2$ value is 5.0 eV, the photon energy of the incident light at the point where Del_2 is 0 expressed by Equation 8 below is 4.0 to 5.0 eV.

$$Del\_2 = \lim_{\Delta PE \to 0}\left(\frac{\Delta pDPS}{\Delta PE}\right) \quad \text{[Equation 8]}$$

In the Equation 8,

The pDPS value is, when the upper surface of the phase shift film is measured with a spectroscopic ellipsometer by applying an incident angle of 64.5° after the light shielding film is removed from the photomask, the phase difference of the P wave and the S wave if the phase difference of the P wave and the S wave of the reflected light is 180° or less, or a value obtained by subtracting the phase difference between the P wave and the S wave from 360° if the phase difference of the P wave and the S wave of the reflected light is more than 180°.

The PE value is the photon energy of the incident light within the range of $PE_1$ to $PE_2$.

The photomask may be manufactured using the blank mask described above. In detail, the photomask may be manufactured by patterning the phase shift film and the light shielding film of the blank mask.

A description of the optical properties of the phase shift film and the light shielding film is overlapped with the description of the optical properties of the phase shift film and the light shielding film described above, and thus will be omitted.

Hereinafter, specific examples will be described in more detail.

Manufacture Example: Formation of Phase Shift Film and Light Shielding Film

Example 1: A quartz transparent substrate having a width of 6 inches, a length of 6 inches, and a thickness of 0.25 inches was disposed in the chamber of the DC sputtering equipment. The target comprising molybdenum and silicon in an atomic ratio of 1:9 was disposed in the chamber to have a T/S distance of 255 mm and the angle between the surface of the substrate and the surface of the target of 25 degrees. A magnet having a magnetic field of 40 mT was disposed on the rear surface of the target.

After that, a sputtering gas mixed in a ratio of Ar:$N_2$:He=10:52:38 was introduced into the chamber, a sputtering power was applied to be 2.05 kW, the magnet was subject to rotate, and thereby a sputtering process was performed. At this time, the rotation speed of the magnet was increased from the initial 100 rpm to a maximum of 155 rpm by 11 rpm per minute. The area in which the film is formed was limited to the area set by the width of 132 mm and the length of 132 mm on the surface of the transparent substrate. The sputtering process was carried out until the photon energy of incident light at the point where the Del_1 value measured with a spectroscopic ellipsometer was 0 by applying an incident angle of 64.5° became 2.0 eV.

After sputtering, the surface of the phase shift film of the blank mask was exposed to Excimer UV light with a wavelength of 172 nm. At this time, the optical power of the UV light was increased to a maximum of 9 mW/cm$^2$ by 3 mW/cm$^2$ per minute, and was maintained at 9 mW/cm$^2$ power for 4 minutes.

Thereafter, the blank mask was introduced into a chamber for a heat treatment process, annealed at 1 Pa, and then cooled naturally. The temperature in the heat treatment process was increased from room temperature to a maximum of 400° C. by 50° C. per minute, and was maintained at the maximum temperature for about 30 minutes. After natural cooling, $O_2$ gas in the chamber for the heat treatment process was introduced into the chamber at a rate of 1 SLM for 30 minutes. At this time, the supply temperature of $O_2$ was about 300° C.

A light shielding film sputtering process was performed on the surface of the phase shift film formed into a film. In detail, a chromium target and the substrate on which and the phase shift film were formed were disposed so that the T/S distance in the sputtering chamber was 255 mm, and the angle between the surface of the substrate and the surface of the target was 25 degrees. A magnet having a magnetic field of 40 mT was disposed on the rear surface of the target.

A sputtering gas having a flow ratio of $Ar:N_2:He:CO_2=19:11:34:37$ was injected in the chamber. After that, the sputtering power is applied to be 1.35 kW, and the photon energy of incident light at the point where the phase difference of reflected light between the P wave and the S wave measured with a spectroscopic ellipsometer is 140° while rotating the magnet was applied until the photon energy of incident light became 1.8 to 2.0 eV. At this time, the rotation speed of the magnet was increased from the initial 100 rpm to a maximum of 155 rpm by 11 rpm per minute.

After the lower layer of the light shielding film was formed, a sputtering gas having an in-chamber flow ratio of $Ar:N_2=57:43$ was injected. After that, sputtering power was applied to be 1.85 KW, and sputtering was performed until the photon energy of incident light at the point where the phase difference of the reflected light between the P wave and the S wave of 140° measured with a spectroscopic ellipsometer became 2.75 to 2.95 eV. At this time, the rotation speed of the magnet was increased from the initial 100 rpm to a maximum of 155 rpm by 11 rpm per minute.

Two samples were totally prepared by applying conditions of the film formation as described above.

Example 2: The sputtering process was performed under the same conditions as in Example 1, but a magnet magnetic field of 45 mT was applied, and the process progress time was carried out until the photon energy of incident light at the point where the Del_1 value was 0 became 1.89 eV.

Example 3: The sputtering process was performed under the same conditions as in Example 1, except that the composition of the sputtering gas was changed to have a ratio of $Ar:N_2:He=8:58:34$.

Example 4: A quartz transparent substrate having a width of 6 inches, a length of 6 inches, and a thickness of 0.25 inches was disposed in the chamber of the DC sputtering equipment. The target comprising molybdenum and silicon in an atomic ratio of 1:9 was disposed in the chamber so that the T/S distance was 255 mm and the angle between the surface of the substrate and the surface of the target was 25 degrees. A magnet having a magnetic field of 40 mT was disposed on the rear surface of the target.

After that, a sputtering gas mixed in a ratio of $Ar:N_2:He=9:52:39$ was introduced into the chamber, and the sputtering process was performed to have a sputtering power of 2 kW, while rotating the magnet at a speed of 150 rpm. The area in which the film is formed was limited to the area set by the width of 132 mm and the length of 132 mm on the surface of the transparent substrate. The sputtering process was performed until the photon energy of incident light at the point where the Del_1 value was 0 became 2.0 eV.

After sputtering, the surface of the phase shift film of the blank mask was exposed to Excimer UV light with a wavelength of 172 nm at a power of 7 $mW/cm^2$ for 5 minutes.

After that, the blank mask was introduced into a chamber for a heat treatment process, annealed at 400° C. at 1 Pa for 30 minutes, and then cooled naturally. After natural cooling, O 2 gas in the chamber for the heat treatment process was introduced into the chamber at a rate of 1 SLM for 30 minutes. At this time, the supply temperature of $O_2$ was about 300° C.

A light shielding film sputtering process was performed on the surface of the phase shift film. Specifically, substrate on which the phase shift film is formed and the chromium target were disposed in the sputtering chamber, a sputtering gas having a flow ratio of $Ar:N_2:He:CO_2=19:11:34:37$ was introduced into the chamber, and the sputtering power was applied to be 1.35 kW to perform sputtering. Sputtering was carried out until the photon energy of incident light at the point where the phase difference of reflected light between the P wave and the S wave of 140° measured with a spectroscopic ellipsometer became 1.9 eV, thereby forming a lower layer of the light shielding film.

Thereafter, sputtering gas having a flow ratio of $Ar:N_2=57:43$ was introduced into the chamber and sputtering was performed by applying a sputtering power of 2.75 kW. Sputtering was carried out until the photon energy of incident light at the point where the phase difference of reflected light between the P wave and the S wave of 140° measured with a spectroscopic ellipsometer became 2.75 eV, thereby forming an upper layer of the light shielding film.

Two samples were totally prepared by applying the conditions of film-formation as described above.

Example 5: The sputtering process was performed under the same conditions as in Example 4, but a magnetic field of 45 mT was applied, and the process progress time was carried out until the photon energy of incident light at the point where the Del_1 value was 0 became 1.89 eV.

Example 6: A sputtering process was performed under the same conditions as in Example 4, except that the composition of the sputtering gas was changed to a ratio of $Ar:N_2:He=8:58:34$.

Comparative Example 1: A quartz transparent substrate having a width of 6 inches, a length of 6 inches, and a thickness of 0.25 inches was disposed in the chamber of the DC sputtering equipment. The target comprising molybdenum and silicon in an atomic ratio of 1:9 was disposed in the chamber so that the T/S distance was 255 mm and the angle between the surface of the substrate and the surface of the target was 25 degrees. A magnet having a magnetic field of 60 mT was disposed on the rear surface of the target.

After that, a sputtering gas mixed in a ratio of $Ar:N_2:He=9:52:39$ was introduced into the chamber, sputtering power was 2 kW, the magnet was rotated at 100 rpm, and thereby a sputtering process was performed. The area in which the film is formed was limited to the area set by the width of 132 mm and the length of 132 mm on the surface of the transparent substrate.

The sputtering process was performed until the photon energy of incident light at the point where the Del_1 value was 0 became 2.0 eV. After film formation, UV light treatment and heat treatment were not applied.

A light shielding film sputtering process was performed on the surface of the phase shift film. Specifically, the T/S distance in the sputtering chamber was 255 mm, and the substrate on which the phase shift film were formed and the chromium target were disposed so that the angle between the surface of the substrate and the surface of the target was 25 degrees. A magnet having a magnetic field of 60 mT was disposed on the rear surface of the target.

A sputtering gas having a flow ratio of $Ar:N_2:He:CO_2$=19:11:34:37 was injected in the chamber. After that, sputtering power was applied to be 1.35 kW, and the photon energy of incident light at the point where the phase difference of reflected light between the P wave and the S wave of 140° measured with a spectroscopic ellipsometer became 1.8 to 2.0 eV. At this time, the rotation speed of the magnet was 100 rpm.

After the lower layer of the light shielding film was formed, a sputtering gas having an in-chamber flow rate ratio of $Ar:N_2$=57:43 was injected. After that, sputtering power was applied to be 1.85 KW, and sputtering was performed until the photon energy of incident light at the point where the phase difference of reflected light between the P wave and the S wave of 140° measured with a spectroscopic ellipsometer became 2.75 to 2.95 eV while rotating the magnet.

Comparative Example 2: A sputtering process was performed under the same conditions as in Comparative Example 1, but a magnet magnetic field of 20 mT was applied. In addition, no additional heat treatment process was applied.

Comparative Example 3: A quartz transparent substrate having a width of 6 inches, a length of 6 inches, and a thickness of 0.25 inches was disposed in the chamber of the DC sputtering equipment. The target comprising molybdenum and silicon in an atomic ratio of 1:9 was placed in the chamber so that the T/S distance was 255 mm and the angle between the substrate and the target was 25 degrees. A magnet having a magnetic field of 60 mT was disposed on the rear surface of the target.

After that, a sputtering gas mixed in a ratio of $Ar:N_2:He$=9:52:39 was introduced into the chamber, and the sputtering process was performed while rotating the magnet at a speed of 100 rpm with a sputtering power of 2 kW. The area in which the thin film was formed was limited to the area set by the width of 132 mm and the length of 132 mm on the surface of the transparent substrate. The sputtering process was performed until the photon energy of incident light at the point where the Del_1 value was 0 became 2.0 eV. No additional UV light treatment and heat treatment were applied.

A light shielding film sputtering process was performed on the surface of the phase shift film formed into a film. Specifically, after the substrate on which the phase shift film was formed and the chromium target were disposed in the sputtering chamber, a sputter gas having a flow ratio of $Ar:N_2:He:CO_2$=19:11:34:37 was introduced into the chamber, and the sputtering power was applied to be 1.35 kW, thereby performing sputtering. Sputtering was carried out until the photon energy of incident light at the point where the phase difference of reflected light between the P wave and the S wave of 140° measured with a spectroscopic ellipsometer reached 1.9 eV, thereby forming a light shielding film lower layer.

After that, sputtering gas having a flow ratio of $Ar:N_2$=57:43 was introduced into the chamber and sputtering was performed by applying 2.75 kW of sputtering power. Sputtering was carried out until the photon energy of incident light at the point where the phase difference of reflected light between the P wave and the S wave of 140° measured with a spectroscopic ellipsometer became 2.75 eV, thereby forming a light shielding film lower layer.

Comparative Example 4: A sputtering process was performed under the same conditions as in Comparative Example 3, but a magnet magnetic field of 20 mT was applied, and the composition of the sputtering gas was changed to have a ratio of $Ar:N_2:He$=8:58:34 in the sputtering process for the phase shift film.

For the samples of Examples 1 to 3 and Comparative Examples 1 and 2, the Del_1 value distribution was measured using a spectroscopic ellipsometer (MG-PRO product available from NANO-VIEW) installed in a sputtering device before the formation of the light shielding film. Specifically, after setting the angle of incident light to be 64.5 with respect to the surface of the phase shift film on which the film formation has been completed for each Example and Comparative Example, the phase difference between P and S waves of reflected light according to photon energy of incident light of incident light was measured and calculated into a Del_1 value. The measurement results of the parameters related to Del_1 value were shown in Table 2 below.

Evaluation Example: XRD Analysis

Normal mode XRD analysis and fixed mode XRD analysis were performed on the lower surface of the transparent substrate of the samples of Examples 1 to 3, Comparative Examples 1 and 2, and normal mode XRD analysis and fixed mode XRD analysis were performed on the upper surface of the light shielding film of the samples. Thereafter, the light shielding film comprised in the sample was removed by etching and cleaning processes to expose the upper surface of the phase shift film.

Normal-mode XRD analysis and fixed-mode XRD analysis were performed on the exposed surface of the phase shift film.

The normal mode XRD analysis was performed under the following conditions.
Equipment name: Rigaku smartlab
x-ray source: Cu target
x-ray information: wavelength 1.542 nm, 45 kV, 200 mA
(Θ-2 Θ) measurement range: 10~100°
Step: 0.05°
Speed: 5°/min The fixed mode XRD analysis was performed under the following conditions.
Equipment name: Rigaku smartlab
x-ray source: Cu target
x-ray information: wavelength 1.542 nm, 45 kV, 200 mA
X-ray generator exit angle: 1°
(Θ-2 Θ) measurement range: 10~100°
Step: 0.05°
Speed: 5°/min The measurement results for each Example and Comparative Example were shown in Table 1 below.

Evaluation Example: Del_1 Value Measurement

The light shielding film was removed from the samples of Examples 4 to 6 and Comparative Examples 3 and 4 through etching. Specifically, after each sample was placed in the chamber, an etching process was performed by supplying a chlorine-based gas as an etchant to remove the light shielding film.

Thereafter, the Del_1 value distribution when $PE_1$ was 1.5 eV and $PE_2$ was 5.0 eV was measured for the sample using a spectroscopic ellipsometer (manufactured by MG-PRO, Nano-View) installed in a sputtering device. Specifically, after setting the angle of incident light to 64.5 with respect to the surface of the phase shift film on which the film formation has been completed for each Example and Comparative Example, the phase difference between P and S waves of reflected light according to photon energy of incident light was measured and calculated into a Del_1 value.

The parameters related to the distribution of the Del_1 measured for each sample were shown in Table 2 below. Graphs showing the distribution of DPS and Del_1 measured for each sample were shown in FIGS. 12 to 21.

Evaluation Example: Phase difference, Transmittance Measurement

For the samples of examples and comparative examples described above, the light shielding film was removed by etching in the same manner as in the XRD analysis method. The phase difference and transmittance were measured using a phase difference/transmittance measuring instrument (MPM193 manufactured by Lasertec). Specifically, by using an ArF light source (wavelength 193 nm) to irradiate light to the region where the phase shift film was formed and the region where the phase shift film was not formed of each sample, the phase difference and transmittance difference values between both regions were measured and calculated. Therefore, it was described in Table 3 below.

Evaluation Example: Contrast and CD value measurement

After a photoresist film was formed on the surface of the phase shift film of each sample in Examples and Comparative Examples, a dense rectangular pattern was exposed on the surface of the photoresist film using Nuflare's EBM 9000 model. The target CD value of the square pattern was set to 400 nm (4X). After a pattern on the photoresist film of each sample was developed, the light shielding film and the phase shift film were etched according to the developed pattern shape using the Tetra X model of Applied Materials. Thereafter, the photoresist pattern was removed and then photomask made from each sample in Example and Comparative Examples was manufactured.

Transferring pattern on a surface of wafer through the exposure process applied to the photomask of each sample. Contrast values and normalized CD values of the transferred pattern were measured and calculated using the AIMS 32 model of Carl Zeiss. For measurement and calculation, the numerical aperture (NA) was set to 1.35, the illumination system was set to crosspole of 30X, outer sigma of 0.8, and in/out sigma ratio of 85%. The measured data were shown in Table 3 below.

Evaluation Example: Measurement and Evaluation of Content of Each Element in the Thickness Direction of Protective Layer For the samples of Examples 4 to 6 and Comparative Examples 3 and 4, the content of each element in the thickness direction of the protective layer was measured. Specifically, using Thermo Scientific's K-alpha model, the analyzer type/channel of 180 degree double focusing hemispherical analyzer/120 channel, the X-ray light source of Al Ka micro-focused, the power of 1 keV, the working pressure of 1E-7 mbar, and a gas of Ar were applied and thereby the content of each element in the thickness direction of the protective layer was measured.

As a result of the measurement, when the protective layer comprised a region in which the ratio of nitrogen content to oxygen content in the thickness direction was 0.4 to 2 and the region had a thickness of 30 to 80% compared to a total thickness of the protective layer, it was evaluated as O, and when the region had a thickness of less than 30% or more than 80% compared to a total thickness of the layer, it was evaluated as X. The measurement results were shown in Table 3 below.

TABLE 1

|  | AI1 | AI2 | AI3 | AI4 | AI5 | AI6 |
| --- | --- | --- | --- | --- | --- | --- |
| Example 1 | 1.00 | 1.02 | 1.01 | 0.99 | 0.96 | 1.0938 |
| Example 2 | 1.01 | 1.02 | 1.02 | 0.99 | 0.95 | 1.10 |
| Example 3 | 1.00 | 1.03 | 1.02 | 1.00 | 0.93 | 1.11 |
| Example 4 | — | — | — | — | — | — |
| Example 5 | — | — | — | — | — | — |
| Example 6 | — | — | — | — | — | — |
| Comparative Example 1 | 0.97 | 0.96 | 0.94 | 1.05 | 0.99 | 1.05 |
| Comparative Example 2 | 0.94 | 0.95 | 0.93 | 1.02 | 0.98 | 1.05 |
| Comparative Example 3 | — | — | — | — | — | — |
| Comparative Example 4 | — | — | — | — | — | — |

TABLE 2

|  | Photon Energy of incident light at the Point where Del_1 value is 0 when $PE_1$ is 1.5 eV and $PE_2$ is 3 eV (eV) | Photon Energy of incident light at the Point where Del_1 is 0 when $PE_1$ is 3 eV and $PE_2$ is 5 eV(eV) | Average Value of Del_1 when $PE_1$ is 1.5 eV and $PE_2$ is S* (°/eV) | Average Value of Del_1 when $PE_1$ is S* and $PE_2$ is B* (°/eV) | Average Value of Del_1 when $PE_1$ is B* and $PE_2$ is 5 eV (°/eV) | Maximum, Value of Del_1 when $PE_1$ is 1.5 eV and $PE_2$ is 5 eV (°/eV) |
| --- | --- | --- | --- | --- | --- | --- |
| Example 1 | 2.00 | 4.44 | — | — | — | — |
| Example 2 | 1.89 | 4.31 | — | — | — | — |
| Example 3 | 2.09 | 4.65 | — | — | — | — |
| Example 4 | 2.02 | 4.46 | 86.5 | −57.3 | 91.6 | 157.5 |
| Example 5 | 1.95 | 4.28 | 82.1 | −58.5 | 102.2 | 187.3 |
| Example 6 | 2.09 | 4.58 | 94.2 | −57.0 | 84.0 | 143.7 |
| Comparative Example 1 | 1.65 | 3.84 | — | — | — | — |

TABLE 2-continued

|  | Photon Energy of incident light at the Point where Del_1 value is 0 when PE$_1$ is 1.5 eV and PE$_2$ is 3 eV (eV) | Photon Energy of incident light at the Point where Del_1 is 0 when PE$_1$ is 3 eV and PE$_2$ is 5 eV(eV) | Average Value of Del_1 when PE$_1$ is 1.5 eV and PE$_2$ is S* (°/eV) | Average Value of Del_1 when PE$_1$ is S* and PE$_2$ is B* (°/eV) | Average Value of Del_1 when PE$_1$ is B* and PE$_2$ is 5 eV (°/eV) | Maximum, Value of Del_1 when PE$_1$ is 1.5 eV and PE$_2$ is 5 eV (°/eV) |
|---|---|---|---|---|---|---|
| Comparative Example 2 | 2.17 | 4.80 | — | — | — | — |
| Comparative Example 3 | 1.71 | 3.79 | 75.0 | −66.8 | −21.8 | 320.0 |
| Comparative Example 4 | 2.15 | 4.65 | 98.3 | −53.5 | 58.1 | 103.5 |

*S* means the minimum value among Photon energies of incident light in a point having the Del_2 value of 0.
*B* means the maximum value among Photon energies of incident light in a point having the Del_2 value of 0.

TABLE 3

|  | Trans-mittance (%) | Phase difference (°) | Normal-ized Contrast | Normal-ized CD | Content Evaluation of Each Element in the Thickness Direction |
|---|---|---|---|---|---|
| Example 1 | 6.1 | 178.5 | 1.000 | 0.99 | — |
| Example 2 | 5.4 | 186.1 | 0.989 | 1.01 | — |
| Example 3 | 6.9 | 172.4 | 0.959 | 1.03 | — |
| Example 4 | 6.1 | 175.7 | 1.000 | 1.00 | ○ |
| Example 5 | 5.6 | 181.0 | 0.992 | 1.01 | ○ |
| Example 6 | 6.4 | 172.6 | 0.977 | 1.02 | ○ |
| Comparative Example 1 | 3.4 | 209.1 | 0.929 | 1.06 | — |
| Comparative Example 2 | 7.8 | 166.0 | 0.883 | 1.10 | — |
| Comparative Example 3 | 3.3 | 205.3 | 0.918 | 1.05 | X |
| Comparative Example 4 | 7.4 | 162.0 | 0.895 | 1.08 | X |

In the Table 1, the AI1, AI2, AI3, and AI4 values of Examples 1 to 3 were measured to be closer to 1 compared to Comparative Examples 1 and 2.

In the Table 3, the transmittance of Examples 1 to 6 was within the range of 5.4 to 6.9%, and the phase difference was within the range of 170 to 190°, but Comparative Examples 1 and 3 had transmittance less than 4%, and the phase difference was measured to be 200° or more and Comparative Examples 2 and 4 had transmittance of 7.4% or more and difference of less than 170°.

In the evaluation of the content of each element in the thickness direction of the protective layer, Examples 4 to 6 were evaluated as O, whereas Comparative Examples 3 and 4 were evaluated as X.

Examples 1 to 6 showed a normalized contrast of 0.95 or more and a normalized CD value of 1.03 or less, whereas Comparative Examples 1 to 4 showed a normalized contrast of less than 0.93 and a normalized CD value of 1.06 or more.

Although the preferred embodiment has been described in detail above, the scope of the present application is not limited thereto, and various modifications and improvements by those skilled in the art using the basic concept of the embodiment defined in the following claims are also within the scope of the present application.

What is claimed is:

1. A method of forming a blank mask, comprising:
preparing a transparent substrate; and
forming a phase shift film on the transparent substrate;
   wherein the phase shift film comprises a phase difference adjustment layer and a protective layer on the phase difference adjustment layer,
   wherein forming the phase shift film on the transparent substrate comprises:
   forming a phase difference adjustment layer on the transparent substrate by sputtering using a magnet disposed on a backside of a sputtering target and rotated during sputtering to generate a magnetic field of 30 mT to 50 mT at the surface of the sputtering target; and
   forming a protective layer on the phase difference adjustment layer;
   wherein the sputtering is performed in an argon-nitrogen-helium atmosphere,
   wherein the sputtering is slopped when then Del$_1$ value measured by elipsometry is apprximately zero at a photon energy of 3.8 eV to 4.64 eV, with PE$_1$=3.0 eV and PE$_2$=5.0 eV,
   wherein the phase shift film has a XRD maximum peak at 2θ of 15° to 30° when a normal mode X-Ray Diffraction (XRD) analysis is performed on an upper surface of the phase shift film,
   where the transparent substrate has a XRD maximum peak at 2θ of 15° to 30° when a normal mode XRD analysis is performed on a lower surface of the transparent substrate, and
   wherein the blank mask has AI1 value of 0.9 to 1.1 expressed by:

$$AI1 = \frac{XM1}{XQ1} \qquad \text{[Equation 1]}$$

where
   XM1 is a maximum value of a measured X-ray intensity when the normal mode XRD analysis is performed on the upper surface of the phase shift film, and
   XQ1 is a maximum value of the measured X-ray intensity when the normal mode XRD analysis is performed on the lower surface of the transparent substrate,
   wherein the blank mask has the photon energy of the incident light at the point where Del_1 expressed by Equation 7 below is 0 is 3.8 to 4.64 eV, when the PE1 value is 3.0 eV and the PE2 value is 5.0 eV;

$$\text{Del}\_1 = \lim_{\Delta PE \to 0}\left(\frac{\Delta DPS}{\Delta PE}\right) \quad \text{[Equation 7]}$$

where in the Equation 7, the DPS value is, after removing the light shielding film from the blank mask, the phase difference between the P wave and the S wave of reflected light if the phase difference between the P wave and S wave of the reflected light is 180° or less, or a value obtained by subtracting the phase difference between the P wave and the S wave of the reflected light from 360° if the phase difference between the P wave and the S wave of the reflected light is more than 180° when the surface of the phase shift film is measured with a spectroscopic ellipsometer by applying an incident angle of 64.5°, and the PE value is the photon energy of the incident light within the range of PE1 to PE2, wherein the phase shift film comprises a phase difference adjustment layer and a protective layer disposed on the phase difference adjustment layer, and wherein the phase shift film comprises a transition metal, silicon, oxygen and nitrogen.

2. The method claim 1, wherein forming the phase shift film on the transparent substrate further comprises irradiating a light with a wavelength of 200 nm or less to a surface of the phase difference adjustment layer by using light source having a power of 2 to 10 mW/cm$^2$ after forming a phase difference adjustment layer on the transparent substrate by sputtering.

3. The method claim 2, wherein irradiating a light with a wavelength of 200 nm or less to a surface of the phase difference adjustment layer is performed for 5 to 20 minutes.

4. The method claim 1, wherein an intensity of sputtering electric power is 1.8 to 2.2 kW in forming a phase difference adjustment layer on the transparent substrate by sputtering.

5. The method claim 1, wherein forming a protective layer on the phase difference adjustment layer comprises heating the phase difference adjustment layer at 150° C. to 500° C.

6. The method claim 1, wherein the phase shift film has a first peak, which is the XRD maximum peak at 2θ of 15° to 25° when the fixed mode XRD analysis is performed on the upper surface of the phase shift film, wherein the transparent substrate has a second peak, which is the XRD maximum peak at 2θ of 15° to 25° when the fixed mode XRD analysis is performed on the lower surface of the transparent substrate, and wherein AI2 value expressed by Equation 2 below is 0.9 to 1.1;

$$AI2 = \frac{XM2}{XQ2} \quad \text{[Equation 2]}$$

wherein the Equation 2, the XM2 is the intensity value of the first peak, and
the XQ2 is the intensity value of the second peak.

7. The method of claim 1, wherein AI3 value expressed by Equation 3 below is 0.9 to 1.1;

$$AI3 = \frac{AM1}{AQ1} \quad \text{[Equation 3]}$$

wherein the Equation 3, the AM1 is an area of the region where 2θ is 15° to 30° in the X-ray intensity graph measured when normal mode XRD analysis is performed on the upper surface of the phase shift film, and the AQ1 is an area of the region where 2θ is 15° to 30° in an X-ray intensity graph measured when normal mode XRD analysis is performed on the lower surface of the transparent substrate.

8. The method of claim 1, wherein AI4 value expressed by Equation 4 below is 0.9 to 1.1;

$$AI4 = \frac{XM4}{XQ4} \quad \text{[Equation 4]}$$

wherein the Equation 4, the XM4 is the X-ray intensity where 2θ is 43° when the normal mode XRD analysis performed on the upper surface of the phase shift film, and the XQ4 is the X-ray intensity where 2θ is 43° when the normal mode XRD analysis performed on the lower surface of the transparent substrate.

9. The method of claim 1, wherein a photon energy of incident light at the point where the Del_1 value according to Equation 7 below is 0 is 1.8 to 2.14 eV when PE1 is 1.5 eV and PE2 is 3 eV;

$$\text{Del}\_1 = \lim_{\Delta PE \to 0}\left(\frac{\Delta DPS}{\Delta PE}\right) \quad \text{[Equation 7]}$$

wherein the Equation 7, the DPS value is a phase difference between the P wave and the S wave of reflected light if the phase difference between the P wave and the S wave of the reflected light is 180° or less or a value obtained by subtracting the phase difference between the P wave and the S wave of the reflected light from 360° if the phase difference between the P wave and the S wave of the reflected light is more than 180°, when the phase shift film is measured with a spectroscopic ellipsometer by applying an incident angle of 64.5°, and the PE value is the photon energy of the incident light within the range of the PE1 value to the PE2 value.

10. The method of claim 1, wherein the photon energy of the incident light at the point where the Del_1 value is 0 is 1.8 to 2.14 eV, when the PE1 value is 1.5 eV and the PE2 value is 3.0 eV.

11. The method of claim 1, wherein the average value of the Del_1 is 78 to 98°/eV, when the PE1 value is 1.5 eV and the PE2 value is the minimum value within photon energy values of incident light at the point where the Del_1 value is 0.

12. The method of claim 1, wherein the average value of the Del_1 is −65 to −55/eV, when the PE1 value is the minimum value within photon energy values of the incident light at the point where the Del_1 value is 0, and the PE2 value is the maximum value within the photon energy values of the incident light at the point where the Del_1 value is 0.

13. The method of claim 1,
wherein the average value of the Del_1 is 60 to 120°/eV, when the PE1 value is the maximum value within photon energy values of incident light at a point where the Del_1 value is 0, and when the PE2 value is 5.0 eV.

14. The method of claim 1,
wherein the maximum value of the Del_1 value is 105 to 300/eV, when the PE1 value is 1.5 eV and the PE2 value is 5.0 eV.

15. The method of claim 1,
wherein the photon energy of the incident light at the point where the maximum value of the Del_1 value is 4.5 eV or more.

16. The method of claim 1,
wherein the phase difference adjustment layer comprises nitrogen in an amount of 40 to 60 atom %,
wherein the protective layer comprises nitrogen in an amount of 20 to 40 atom %, and
wherein the protective layer comprises a region in which the ratio of nitrogen content to oxygen content in the thickness direction is 0.4 to 2, and the region has a thickness of 30 to 80% compared to a total thickness of the protective layer.

* * * * *